United States Patent
Ogiwara et al.

(10) Patent No.: US 10,461,264 B2
(45) Date of Patent: Oct. 29, 2019

(54) ORGANIC ELECTROLUMINESCENT ELEMENT

(71) Applicant: IDEMITSU KOSAN CO., LTD., Chiyoda-ku (JP)

(72) Inventors: Toshinari Ogiwara, Sodegaura (JP); Ryo Tsuchiya, Ichihara (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 0 days.

(21) Appl. No.: 16/016,871

(22) Filed: Jun. 25, 2018

(65) Prior Publication Data

US 2018/0309068 A1 Oct. 25, 2018

Related U.S. Application Data

(63) Continuation of application No. 15/438,054, filed on Feb. 21, 2017, now Pat. No. 10,032,998, which is a (Continued)

(30) Foreign Application Priority Data

Jul. 20, 2012 (JP) .................. 2012-162013

(51) Int. Cl.
*H01L 51/00* (2006.01)
*H01L 51/50* (2006.01)
(Continued)

(52) U.S. Cl.
CPC ............ *H01L 51/0072* (2013.01); *C09B 1/00* (2013.01); *C09B 57/00* (2013.01); *C09B 57/008* (2013.01);
(Continued)

(58) Field of Classification Search
CPC .......................... H01L 51/006; H01L 51/0052
See application file for complete search history.

(56) References Cited

U.S. PATENT DOCUMENTS

| | | |
|---|---|---|
| 7,683,536 B2 | 3/2010 | Forrest |
| 2004/0086745 A1 | 5/2004 | Iwakuma et al. |

(Continued)

FOREIGN PATENT DOCUMENTS

| | | |
|---|---|---|
| JP | 2007 520061 | 7/2007 |
| WO | 03 080760 | 10/2003 |

(Continued)

OTHER PUBLICATIONS

Endo, A. et al., "Efficient up-conversion of triplet excitons into a single state and its application for organic light emitting diodes", Applied Physics Letters 98, 083302, Total 3 pages, (Feb. 24, 2011).

(Continued)

*Primary Examiner* — Caridad Everhart
*Assistant Examiner* — Ankush K Singal
(74) *Attorney, Agent, or Firm* — Oblon, McClelland, Maier & Neustadt, L.L.P.

(57) ABSTRACT

An organic EL device includes a pair of electrodes and an organic compound layer between pair of electrodes. The organic compound layer includes an emitting layer including a first material, a second material and a third material, in which singlet energy EgS(H) of the first material, singlet energy EgS(H2) of the second material, and singlet energy EgS(D) of the third material satisfy a specific relationship.

28 Claims, 12 Drawing Sheets

Related U.S. Application Data continuation of application No. 14/938,296, filed on Nov. 11, 2015, now Pat. No. 9,608,209, which is a continuation of application No. 14/414,199, filed as application No. PCT/JP2013/069133 on Jul. 12, 2013, now Pat. No. 9,219,242.

(51) Int. Cl.
| | | |
|---|---|---|
| C09K 11/02 | (2006.01) | |
| C09K 11/06 | (2006.01) | |
| C09B 57/00 | (2006.01) | |
| C09B 1/00 | (2006.01) | |

(52) U.S. Cl.
CPC ............ *C09K 11/025* (2013.01); *C09K 11/06* (2013.01); *H01L 51/006* (2013.01); *H01L 51/0054* (2013.01); *H01L 51/0058* (2013.01); *H01L 51/0061* (2013.01); *H01L 51/0067* (2013.01); *H01L 51/0077* (2013.01); *H01L 51/50* (2013.01); *H01L 51/5004* (2013.01); *H01L 51/5012* (2013.01); *H01L 51/5016* (2013.01); *C09K 2211/1007* (2013.01); *C09K 2211/1011* (2013.01); *C09K 2211/1014* (2013.01); *C09K 2211/1029* (2013.01); *H01L 51/0052* (2013.01); *H01L 51/0056* (2013.01); *H01L 51/0073* (2013.01); *H01L 51/5056* (2013.01); *H01L 51/5072* (2013.01); *H01L 2251/5384* (2013.01); *H01L 2251/552* (2013.01)

(56) References Cited

U.S. PATENT DOCUMENTS

| | | | |
|---|---|---|---|
| 2005/0153163 A1 | 7/2005 | Klubek et al. | |
| 2005/0158578 A1 | 7/2005 | Iwakuma et al. | |
| 2005/0249976 A1 | 11/2005 | Iwakuma et al. | |
| 2010/0295444 A1 | 11/2010 | Kuma et al. | |
| 2010/0301318 A1 | 12/2010 | Kuma et al. | |
| 2011/0175071 A1 | 7/2011 | Masui | |
| 2011/0278555 A1 | 11/2011 | Inoue et al. | |
| 2011/0309337 A1 | 12/2011 | Nishimura et al. | |
| 2012/0248968 A1* | 10/2012 | Ogiwara | H01L 51/5012 313/504 |
| 2012/0298975 A1 | 11/2012 | Iwakuma et al. | |
| 2012/0319099 A1 | 12/2012 | Iwakuma et al. | |
| 2013/0020558 A1 | 1/2013 | Ogiwara | |
| 2013/0292664 A1 | 11/2013 | Nishimura et al. | |

FOREIGN PATENT DOCUMENTS

| | | |
|---|---|---|
| WO | 03 080761 | 10/2003 |
| WO | 2010 134350 A1 | 11/2010 |
| WO | 2010 134352 | 11/2010 |
| WO | 2011 070963 | 6/2011 |
| WO | WO 2011/132684 A1 | 10/2011 |
| WO | WO 2012/073888 A1 | 6/2012 |
| WO | 2012 133188 | 10/2012 |

OTHER PUBLICATIONS

Satoh, K. et al., "Expression of Highly-Efficient Thermally-Activated Delayed-Fluorescence and Application Thereof to OLED", Organic EL Symposium, pp. 11-12, (Jun. 2010), with English abstract and English translation.

Nasu, K. et al., "Development of Highly Efficient Electroluminescence Devices Utilizing Thermally Activated Delayed Fluorescence of Spiro-Structured Molecules", The Chemical Society of Japan, Total 1 page, (Mar. 2012), with English abstract and English translation.

Tokumaru, K. et al., "Organic Photochemical Reaction Theory", Tokyo Kagaku Dojin Co., Ltd., pp. 78-83, (Mar. 31, 1973), with English abstract and English translation.

Kang, J. et al., "Prevention of H-Aggregates Formation in Cy5 Labeled Macromolecules", International Journal of Polymer Science, vol. 2010, pp. 1-7, (Mar. 14, 2010).

Kasha, M. et al., "The Exciton Model in Molecular Spectroscopy", Pure and Applied Chemistry, vol. 11, pp. 371-392, (1965).

Das, S. et al., "Can H-Aggregates Serve as Light-Harvesting Antennae? Triplet-Triplet Energy Transfer between Excited Aggregates and Monomer Thionine in Aersol-OT Solutions", J. Phys. Chem. B, vol. 103, pp. 209-215, (1999).

International Search Report dated Oct. 1, 2013 in PCT/JP13/069133 Filed Jul. 12, 2013.

Atkins, P.W. et. al., "Physical Chemistry", Seventh Edition, 1978, pp. 395-397.

Extended Search Report dated Jun. 13, 2016 in European Patent application No. 13819814.8.

Japanese Office Action dated Mar. 13, 2018 in Patent Application No. 2017-056711 (with English translation of the Bibliographic Data), citing documents AO and AP therein, 1 page.

\* cited by examiner

ORGANIC ELECTROLUMINESCENT ELEMENT

TECHNICAL FIELD

The present invention relates to an organic electroluminescence device.

BACKGROUND ART

When a voltage is applied to an organic electroluminescence device (hereinafter referred to as an organic EL device), holes are injected from an anode into an emitting layer and electrons are injected from a cathode into the emitting layer. The injected holes and electrons are recombined in the emitting layer to form excitons. Here, according to the electron spin statistics theory, singlet excitons and triplet excitons are generated at a ratio of 25%:75%. In the classification according to the emission principle, in a fluorescent EL device which uses emission caused by singlet excitons, an internal quantum efficiency of the organic EL device is believed to be limited to 25%. On the other hand, it has been known that the internal quantum efficiency can be improved up to 100% under efficient intersystem crossing from the singlet excitons in a phosphorescent EL device which uses emission caused by triplet excitons.

A technology for extending a lifetime of a fluorescent organic EL device has recently been improved and applied to a full-color display of a mobile phone, TV and the like. However, an efficiency of the fluorescent organic EL device is required to be improved.

Based on such a background, a highly efficient fluorescent organic EL device using delayed fluorescence has been proposed and developed. For instance, Patent Literatures 1 and 2 each disclose an organic EL device using TTF (Triplet-Triplet Fusion) mechanism that is one of mechanisms for delayed fluorescence. The TTF mechanism utilizes a phenomenon in which a singlet exciton is generated by collision between two triplet excitons.

By using delayed fluorescence caused by the TTF mechanism, it is considered that an internal quantum efficiency can be theoretically raised up to 40% even in fluorescent emission. However, as compared with phosphorescent emission, the fluorescent emission still needs to be improved in efficiency. Accordingly, in order to further improve the internal quantum efficiency, an organic EL device using another delayed fluorescence mechanism has been studied.

For instance, TADF (Thermally Activated Delayed Fluorescence) mechanism is used. The TADF mechanism utilizes a phenomenon in which reverse intersystem crossing from triplet excitons to singlet excitons is generated by using a material having a small energy difference ($\Delta ST$) between the singlet level and the triplet level. An organic EL device using the TADF mechanism is disclosed in, for instance, non-Patent Literature 1. In the organic EL device of non-Patent Literature 1, a compound having a small $\Delta ST$ is used as a dopant material to cause reverse intersystem crossing from the triplet level to the singlet level by heat energy. It is considered that the internal quantum efficiency can be theoretically raised up to 100% even in fluorescent emission by using delayed fluorescence by the TADF mechanism, Non-Patent Literature 2 discloses an organic EL device having a doped film including a specific host material and a specific compound having a Spiro skeleton as a dopant material. The organic EL device exhibits a high external quantum efficiency by using the TADF mechanism.

CITATION LIST

Patent Literature(s)

Patent Literature 1: International Publication No. WO2010/134350
Patent Literature 2: International Publication No. WO2011/070963

Non-Patent Literature(s)

Non-Patent Literature 1: "Expression of Highly-Efficient Thermally-Activated Delayed-Fluorescence and Application thereof to OLED" Organic EL Symposium, proceeding for the tenth meeting edited by Chihaya Adachi et al., pp. 11-12, Jun. 17-18, 2010
Non-Patent Literature 2: "Development of Highly Efficient Electroluminescence Devices Utilizing Thermally Activated Delayed Fluorescence of Spiro-Structured Molecules" Chemical Society of Japan, proceeding for the 92nd Spring meeting on Mar. 25-28, 2012 edited by Chihaya Adachi et al., 3M3-37

SUMMARY OF THE INVENTION

Problem(s) to be Solved by the Invention

Although the organic EL devices disclosed in the non-Patent Literatures 1 and 2 exhibit the maximum luminous efficiency in a low current density range at 0.01 mA/cm$^2$, so-called roll-off is generated in a practically high current density range ranging from approximately 1 mA/cm$^2$ to 10 mA/cm$^2$, so that the luminous efficiency is decreased.

Accordingly, it is considered that many practical problems in using delayed fluorescence by the TADF mechanism are left unsolved, among which improvement in the luminous efficiency in the practically high current density range has been particularly demanded.

An object of the invention is to provide an organic electroluminescence device efficiently emitting light in a practically high current density range.

Means for Solving the Problem(s)

According to an aspect of the invention, an organic electroluminescence device includes a pair of electrodes and an organic compound layer therebetween, the organic compound layer including an emitting layer including: a first material; a second material; and a third material, in which singlet energy EgS(H1) of the first material, singlet energy EgS(H2) of the second material, and singlet energy EgS(D) of the third material satisfy a relationship of numerical formulae (1) and (2) below, a difference $\Delta ST(H1)$ between the singlet energy EgS(H1) of the first material and an energy gap Eg$_{77K}$(H1) at 77K of the first material satisfies a relationship of a numerical formula (3) below, the second host material is a compound having a fused aromatic hydrocarbon group having 10 to 30 ring carbon atoms or a fused aromatic heterocyclic group having 8 to 30 ring atoms, and the third material is a fluorescent material.

$$EgS(H1) > EgS(D) \tag{1}$$

$$EgS(H2) > EgS(D) \tag{2}$$

$$\Delta ST(H1) = EgS(H1) - Eg_{77K}(H1) < 0.3 \text{ [eV]} \tag{3}$$

BRIEF DESCRIPTION OF DRAWING(S)

FIG. 1 schematically shows an exemplary arrangement of an organic electroluminescence device according to an exemplary embodiment of the invention.

DESCRIPTION OF EMBODIMENT(S)

Arrangement(s) of Organic EL Device

Figure 1:
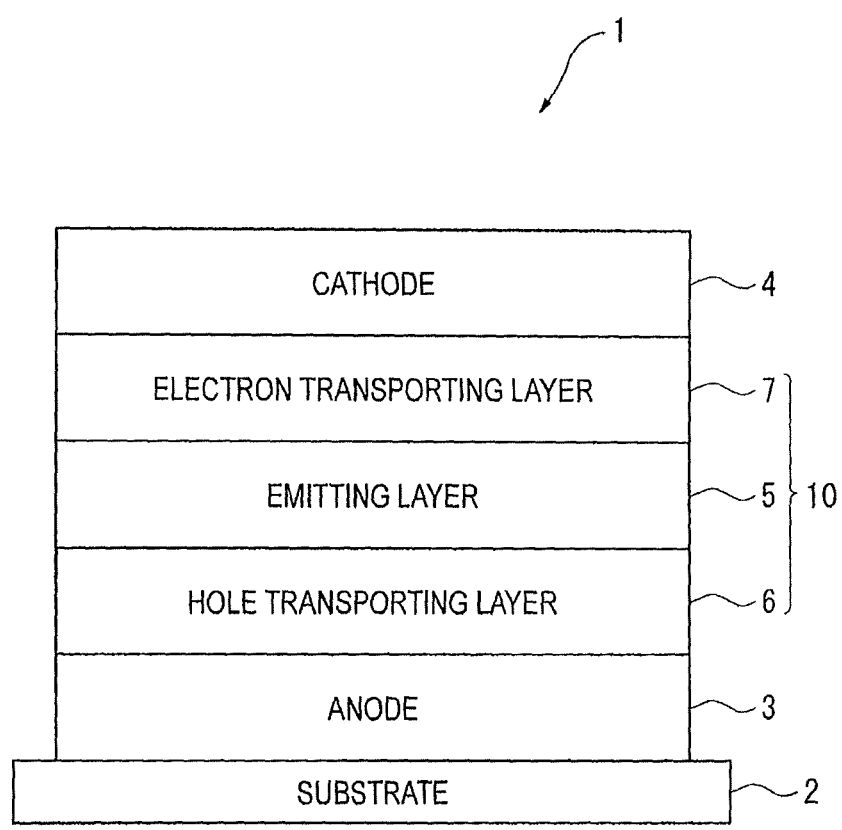

Arrangement(s) of an organic EL device according to an exemplary embodiment of the invention will be described below.

The organic EL device according to the exemplary embodiment includes a pair of electrodes and an organic compound layer therebetween. The organic compound layer includes at least one layer formed of an organic compound. The organic compound layer may include an inorganic compound.

In the organic EL device according to the exemplary embodiment, at least one layer of the organic compound layer includes an emitting layer. Accordingly, the organic compound layer may be provided by a single emitting layer. Alternatively, the organic compound layer may be provided by layers applied in a known organic EL device such as a hole injecting layer, a hole transporting layer, an electron injecting layer, an electron transporting layer, a hole blocking layer and an electron blocking layer.

The following are representative structure examples of an organic EL device:
(a) anode/emitting layer/cathode;
(b) anode/hole injecting-transporting layer/emitting layer/cathode;
(c) anode/emitting layer/electron injecting•transporting layer/cathode;
(d) anode/hole injecting•transporting layer/emitting layer/electron injecting-transporting layer/cathode; and
(e) anode/hole injecting•transporting layer/emitting layer/blocking layer/electron injecting•transporting layer/cathode.

While the arrangement (d) is preferably used among the above arrangements, the arrangement of the invention is not limited to the above arrangements.

It should be noted that the aforementioned "emitting layer" is an organic compound layer generally employing a doping system and including a first material, a second material and a third material. In general, the first and second materials promote recombination of electrons and holes and transmit excitation energy generated by recombination to the third material. The first and second materials are often referred to as a host material. Accordingly, the first material is referred to as a first host material and the second material is referred to as a second host material in descriptions hereinafter. In general, the third material receives the excitation energy from the host material (the first and second materials) to exhibit a high luminescent performance. The third material is often referred to as a dopant material. Accordingly, the third material is referred to as a dopant material in descriptions hereinafter. The dopant material is preferably a compound having a high quantum efficiency. In the exemplary embodiment, in at least one emitting layer, a material emitting fluorescence (fluorescent dopant material) is used as the dopant material.

The "hole injecting/transporting layer" means "at least one of a hole injecting layer and a hole transporting layer" while the "electron injecting/transporting layer" means "at least one of an electron injecting layer and an electron transporting layer." Herein, when the hole injecting layer and the hole transporting layer are provided, the hole injecting layer is preferably close to the anode. When the electron injecting layer and the electron transporting layer are provided, the electron injecting layer is preferably close to the cathode.

In the exemplary embodiment, the electron transporting layer means an organic layer having the highest electron mobility among organic layer(s) providing an electron transporting zone existing between the emitting layer and the cathode. When the electron transporting zone is provided by a single layer, the single layer is the electron transporting layer. Moreover, a blocking layer having an electron mobility that is not always high may be provided as shown in the arrangement (e) between the emitting layer and the electron transporting layer in order to prevent diffusion of excitation energy generated in the emitting layer. Thus, the organic layer adjacent to the emitting layer is not always an electron transporting layer.

FIG. 1 schematically shows an exemplary structure of the organic EL device according to the exemplary embodiment of the invention.

An organic EL device 1 includes a light-transmissive substrate 2, an anode 3, a cathode 4, and an organic compound layer 10 disposed between the anode 3 and the cathode 4.

The organic compound layer 10 includes an emitting layer 5 containing a host material and a dopant material. The organic compound layer 10 also includes a hole transporting layer 6 between the emitting layer 5 and the anode 3. The organic compound layer 10 further includes an electron transporting layer 7 between the emitting layer 5 and the cathode 4.

Emitting Layer

In this exemplary embodiment, as described above, the first, second and third materials satisfying specific conditions are respectively used as the first host material, the second host material and the dopant material in the emitting layer. The materials and specific conditions will be described below.

In the emitting layer, singlet energy EgS(H1) of the first host material, singlet energy EgS(H2) of the second host material and singlet energy EgS(D) of the dopant material satisfy a relationship according to the following numerical formulae (1) and (2), and a difference ΔST(H1) between the singlet energy EgS(H1) of the first host material and an energy gap $Eg_{77K}$(H1) at 77K of the first host material satisfies a relationship according to the following numerical formula (3).

$$EgS(H1) > EgS(D) \quad (1)$$

$$EgS(H2) > EgS(D) \quad (2)$$

$$\Delta ST(H1) = EgS(H1) - Eg_{77K}(H1) < 0.3 \text{ [eV]} \quad (3)$$

It is preferable that the difference ΔST(H1) between the singlet energy EgS(H1) of the first material and the energy gap $Eg_{77K}$(H1) at 77K of the first material satisfies a relationship of the following numerical formula (4).

$$\Delta ST(H1) = EgS(H1) - Eg_{77K}(H1) < 0.2 \text{ [eV]} \quad (4)$$

It is preferable that an energy gap $Eg_{77K}$(H2) at 77K of the second host material and an energy gap $Eg_{77K}$(D) at 77K of the dopant material satisfy a relationship of the following numerical formula (5).

$$Eg_{77K}(H2) < Eg_{77K}(D) \quad (5)$$

When the energy gap of the second host material and the energy gap of the dopant material satisfy the numerical formula (5), energy can be transferred from the triplet level of the dopant material to the triplet level of the second host material. With this energy transfer, triplet excitons contributing to a below-described TTF mechanism are increased in the second host material, so that energy is more efficiently transferred.

It is preferable that the energy gap $Eg_{77K}$(H1) at 77K of the first host material and the energy gap $Eg_{77K}$(H2) at 77K of the second material satisfy a relationship of the following numerical formula (6).

$$Eg_{77K}(H1) - Eg_{77K}(H2) > 0.5 \text{ [eV]} \quad (6)$$

When the energy gap of the first host material and the energy gap of the second host material satisfy the numerical formula (6), the triplet excitons of the first host material are unlikely to be transferred from the triplet level of the first host material to the triplet level of the second host material, so that energy transfer from the first host material can be inhibited.

The energy gap $Eg_{77K}$(H1) and the energy gap $Eg_{77K}$(H2) preferably satisfy a relationship of the following numerical formula (6-1), particularly preferably a relationship of the following numerical formula (6-2).

$$Eg_{77K}(H1) - Eg_{77K}(H2) \geq 0.8 \text{ [eV]} \quad (6-1)$$

$$Eg_{77K}(H1) - Eg_{77K}(H2) \geq 0.9 \text{ [eV]} \quad (6-2)$$

The energy gap $Eg_{77K}$(H1) at 77K of the first host material and the energy gap $Eg_{77K}$(D) at 77K of the dopant material satisfy a relationship of the following numerical formula (7).

$$\Delta T = Eg_{77K}(H1) - Eg_{77K}(D) > 0.5 \text{ [eV]} \quad (7)$$

When the energy gap of the first host material and the energy gap of the dopant material satisfy the numerical formula (7), the excitons of the first host material are unlikely to be transferred from the triplet level of the first host material to the triplet level of the dopant host material, so that energy transfer from the first host material can be inhibited.

The energy gap $Eg_{77K}$(H1) and the energy gap $Eg_{77K}$(D) preferably satisfy a relationship of the following numerical formula (7-1), particularly preferably a relationship of the following numerical formula (7-2).

$$\Delta T = Eg_{77K}(H1) - Eg_{77K}(H2) \geq 0.9 \text{ [eV]} \quad (7-1)$$

$$\Delta T = Eg_{77K}(H1) - Eg_{77K}(H2) \geq 1.0 \text{ [eV]} \quad (7-2)$$

A difference in the energy gap between the first host material and the fluorescent dopant material ($Eg_{77K}$(H1)−$Eg_{77K}$(D)) is denoted by ΔT.

First Host Material

ΔST

The organic EL device emits light with a high efficiency in a high current density range by using a compound having a small energy difference (ΔST) between singlet energy EgS and triplet energy EgT as the first host material. The ΔST of the first host material is referred to as ΔST(H1).

From quantum chemical viewpoint, decrease in the difference (ΔST) between the singlet energy EgS and the triplet energy EgT can be achieved by a small exchange interaction therebetween. Physical details of the relationship between ΔST and the exchange interaction are exemplarily described in the following:

Literature 1: Organic EL Symposium, proceeding for the tenth meeting edited by Chihaya Adachi et al., S2-5, pp. 11-12; and Literature 2: Organic Photochemical Reaction Theory edited by Katsumi Tokumaru, Tokyo Kagaku Dojin Co., Ltd. (1973).

Such a material can be synthesized according to molecular design based on quantum calculation. Specifically, the material is a compound in which a LUMO electron orbit and a HOMO electron orbit are localized to avoid overlapping.

Examples of the compound having a small ΔST, which is used as the first host material in the exemplary embodiment, are compounds in which a donor element is bonded to an acceptor element in a molecule and ΔST is in a range of 0 eV or more and less than 0.3 eV in terms of electrochemical stability (oxidation-reduction stability).

A more preferable compound is such a compound that dipoles formed in the excited state of a molecule interact with each other to form an aggregate having a reduced exchange interaction energy. According to analysis by the inventors, the dipoles are oriented substantially in the same direction in the compound, so that ΔST can be further reduced by the interaction of the molecules. In such a case, ΔST can be extremely small in a range of 0 eV to 0.2 eV.

Aggregate

Figure 2:
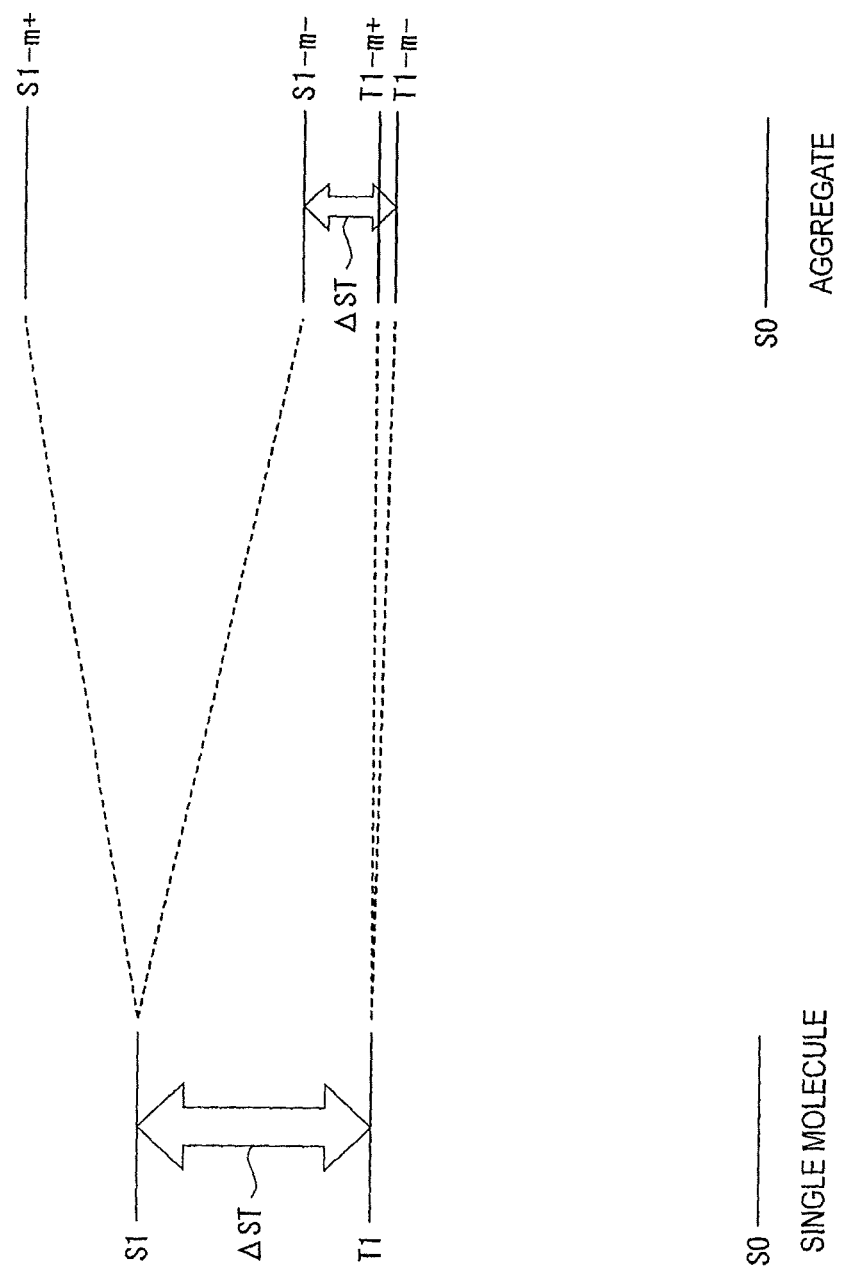
FIG. 2 shows an example of physics models with aggregate formation.

Decrease in the energy difference (ΔST) between the singlet energy EgS and the triplet energy EgT can also be achieved by aggregate formation. Herein, the aggregate does not reflect an electronic state by a single molecule, but the aggregate is provided by several molecules physically approaching each other. After the plurality of molecules approach each other, electronic states of a plurality of molecules are mixed and changed, thereby changing an energy level. A value of singlet energy is mainly decreased, thereby decreasing a value of ΔST. The decrease in the value of ΔST by the aggregate formation can also be explained by Davydov splitting model showing that two molecules approach each other to change electronic states thereof (see FIG. 2). As shown in Davydov splitting model, it is considered that change of the electronic states by two molecules different from change of an electronic state by a single molecule is brought about by two molecules physically approaching each other. A singlet state exists in two states represented by S1–m$^+$ and S1 m$^-$. A triplet state exists in two states represented by T1-m$^+$ and T1-m$^-$. Since S1-m$^-$ and T1-m$^-$ showing a lower energy level exist, ΔST representing a difference between S1-m$^-$ and T1-m$^-$ becomes smaller than that in the electronic state by a single molecule.

The Davydov splitting model is exemplarily described in the following:

Literature 3: J. Kang, et al, International Journal of Polymer Science, Volume 2010, Article ID 264781;

Literature 4: M. Kasha, et al, Pure and Applied Chemistry, Vol. 11, pp 371, 1965; and Literature 5: S. Das, et al, J. Phys. Chem. B. vol. 103, p 209, 1999.

The inventors found usage of sublevels of a singlet state and a triplet state of a compound easily forming an aggregate in a thin film, and consequent possibility of promotion of reverse intersystem crossing by molecules and aggregates in the thin film.

For instance, a compound having a large half bandwidth of a photoluminescence spectrum is considered to easily form an aggregate in a thin film of the compound. A relationship between the half bandwidth of the photoluminescence spectrum and easy formability of the aggregate can be estimated as follows.

In a compound having a property of typically existing as a single molecule without forming an aggregate, a vibrational level is less recognized in the singlet state, so that a narrow half bandwidth of the photoluminescence spectrum is observed. For instance, CBP (4,4'-bis[9-dicarbazolyl]-2,2'-biphenyl) exhibits a property to typically exist as a single molecule, in which a half bandwidth of a photoluminescence spectrum is about 50 nm.

On the other hand, in the compound easily forming the aggregate, a plurality of molecules electronically influence each other, whereby a lot of vibrational levels exist in the singlet state. As a result, since the vibrational levels of the singlet state are often relaxed to the ground state, the half bandwidth of the photoluminescence spectrum is increased.

Such a compound easily forming the aggregate is expected to have a lot of vibrational levels even in a triplet state. Consequently, it is speculated that ΔST in relation to heat is decreased through the sublevels to promote the reverse intersystem crossing, since a lot of sublevels exist between the singlet state and the triplet state.

It should be noted that the aggregate according to the exemplary embodiment means that a single molecule forms any aggregate with another single molecule. In other words, a specific aggregate state is not shown in the exemplary embodiment. An aggregate state of an organic molecule is probably formable in various states in a thin film, which is different from an aggregate state of an inorganic molecule.

TADF Mechanism

As described above, when ΔST(H1) of the organic material is small, reverse intersystem crossing from the triplet level of the first host material to the singlet level of the first host material is easily caused by heat energy given from the outside. Herein, an energy state conversion mechanism to perform spin exchange from the triplet state of electrically excited excitons within the organic EL device to the singlet state by reverse intersystem crossing is referred to as TADF Mechanism.

In the exemplary embodiment, since the compound having a small ΔST(H1) is used as the first host material, reverse intersystem crossing from the triplet level of the first host material to the singlet level of the first host material is easily caused by heat energy given from the outside.

Figure 3:
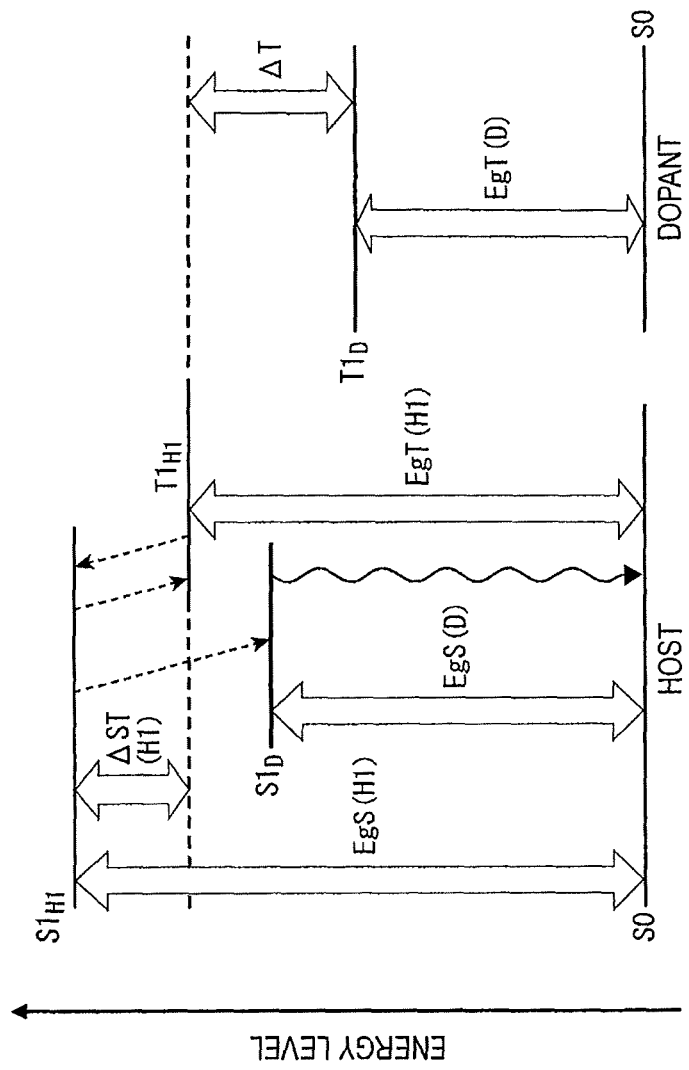
FIG. 3 shows a relationship between energy levels of a host material and a dopant material in an emitting layer.

FIG. 3 shows a relationship in energy level between the first host material and the dopant material in the emitting layer. In FIG. 3, S0 represents a ground state, $S1_{H1}$ represents a lowest singlet state of the first host material, $T1_{H1}$ represents a lowest triplet state of the first host material, $S1_D$ represents a lowest singlet state of the dopant material, and $T1_D$ represents a lowest triplet state of the dopant material. As shown in FIG. 3, a difference between $S1_{H1}$ and $T1_{H1}$ corresponds to ΔST(H1), a difference between $S1_{H1}$ and S0 corresponds to EgS(H1), a difference between $S1_D$ and S0 corresponds to EgS(D), and a difference between $T1_{H1}$ and $T1_D$ corresponds to ΔT. A dotted-line arrow shows energy transfer between the respective excited states in FIG. 3.

As described above, a compound having a small ΔST(H) is selected as the compound for the first host material in the exemplary embodiment. This is because the material having a small ΔST(H1) is considered to easily cause reverse intersystem crossing from the triplet excitons generated in the lowest triplet state $T1_{H1}$ to the lowest singlet state $S1_{H1}$ of the first host material by heat energy. Due to the small ΔST(H1), reverse intersystem crossing is easily caused, for instance, even around a room temperature. When the reverse intersystem crossing is thus easily caused, a ratio of energy transfer from the first host material to the lowest singlet state $S1_D$ of the fluorescent dopant material is increased by Förster transfer, resulting in improvement in a luminous efficiency of a fluorescent organic EL device.

In other words, use of the compound having a small ΔST(H1) as the first host material increases emission by the TADF mechanism, so that a delayed fluorescence ratio becomes large. When the delayed fluorescence ratio is large, a high internal quantum efficiency is achievable. It is considered that the internal quantum efficiency can be theoretically raised up to 100% even by using delayed fluorescence by the TADF mechanism.

Figure 4:
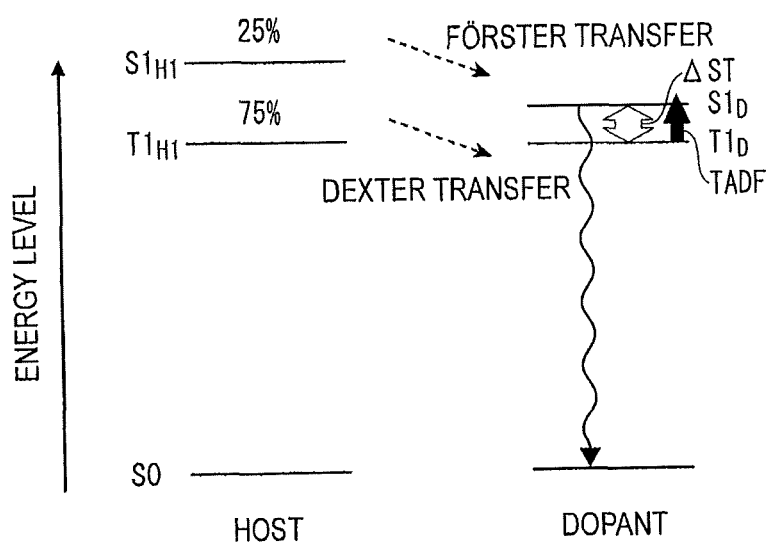
FIG. 4 shows a relationship between energy levels of a host material and a dopant material in an emitting layer.

FIG. 4 shows a relationship in energy level between the first host material and the dopant material in the emitting layer in the TADF mechanism described in Patent Literature 1. In FIG. 4, S0, $S1_{H1}$, $T1_{H1}$, $S1_D$, and $T1_D$ represent the same as those in FIG. 3. A dotted-line arrow shows energy transfer between the respective excited states. As shown in FIG. 4, a material having a small ΔST(D) is used as the dopant material in the TADF mechanism described in non-Patent Literature 1. Accordingly, energy is transferred from the lowest triplet state $T1_{H1}$ of the first host material to the lowest singlet state $S1_D$ or the lowest triplet state $T1_D$ of the dopant material by Dexter transfer. Further, reverse intersystem crossing from the lowest triplet state $T1_D$ to the lowest singlet state $S1_D$ of the dopant material is possible by heat energy. As a result, fluorescent emission from the lowest singlet state $S1_D$ of the dopant material can be observed. It is considered that the internal quantum efficiency can be theoretically raised up to 100% also by using delayed fluorescence by the TADF mechanism.

The inventors herein employ a fluorescent compound having a small ΔST(H1) as described in non-Patent Literature 1 as the first host material in a host-dopant system. The reasons are detailed as follows.

First, considering conversion of energy states on the dopant material by the TADF mechanism, the dopant material has a relatively high singlet energy for fluorescent emission and triplet energy approximately equivalent to the singlet energy. In order to efficiently trap the triplet energy within the emitting layer, it is necessary to select the first host material having larger triplet energy. If a typical organic material usually having a large $\Delta ST$ is used as the first host material, the singlet energy of the first host material, i.e., an energy gap between a HOMO level and a LUMO level becomes extremely large. As a result, an energy gap between the first host material and a carrier transporting layer adjacent to the emitting layer becomes large, so that injection of carriers to the emitting layer is considered to become difficult. Accordingly, the inventors consider that conversion of the energy states by the TADF mechanism is preferably performed on the first host material, whereby the carriers are advantageously injected to the emitting layer and are easily balanced in the entire organic EL device.

Secondly, the inventors believe it possible to suppress decrease in a luminous efficiency caused by Triplet-Triplet-Annihilation in a high current density range by using the fluorescent compound having a small $\Delta ST(H1)$ as the first host material. Herein, Triplet-Triplet-Annihilation (hereinafter, referred to as TTA) is a physical phenomenon in which long-life triplet excitons generated on a molecule are adjacent to each other at a high density to collide with each other and are thermally deactivated.

The inventors believe it possible to suppress decrease in the luminous efficiency in the high current density range to some extent in the host-dopant system in which the triplet energy is difficult to transit from the first host material to the dopant material. In the exemplary embodiment, the compound having a small $\Delta ST$ is used as the first host material of the emitting layer. After reverse intersystem crossing from a triplet excited level of the first host material to a singlet excited level thereof by the TADF mechanism, energy is transferred to a singlet excited level of the dopant material. Accordingly, the generated triplet excitons are kept in a triplet excited state on the first host material whose abundance ratio is high in the emitting layer. On the other hand, if the compound having a small $\Delta ST$ is used as the dopant material in the emitting layer, the generated triplet excitons are kept in a triplet excited state on the dopant material whose abundance ratio is extremely low in the emitting layer. In other words, the inventors believe it preferable to design a system that avoids concentration of triplet excited state on the dopant material in driving the organic EL device in the high current density range. Accordingly, in the exemplary embodiment, the inventors employ the compound having a small $\Delta ST(H1)$ as the first host material.

Thirdly, a material having a high emission quantum efficiency can be easily selected as the dopant material by using a material causing reverse intersystem crossing from the triplet level to the singlet level as the first host material. As a result, emission of the singlet excitons is quickly relaxed after energy transfer thereof to the dopant material, so that energy quenching in the high current density range is suppressible. In the host-dopant system in a fluorescent device, generally, the first host material has a carrier transporting function and an exciton generating function and the dopant material has an emission function. This system is for separating the carrier transporting function and the emission function of the emitting layer. Accordingly, effective organic EL emission is promoted by doping a small amount of a dopant material having a high emission quantum efficiency into the emitting layer. The emitting layer according to the exemplary embodiment is required to have a function to cause reverse intersystem crossing by the TADF function in addition to a typical function of the emitting layer. By requiring the first host material to have the function to cause reverse intersystem crossing by the TADF mechanism, the inventors increased options for the dopant material having a high emission quantum efficiency which largely contributes to the luminous efficiency of the organic EL device. With this arrangement, a fluorescent dopant material typically known as being highly efficient can be selected.

Relationship Between EgT and $Eg_{77K}$

In this exemplary embodiment, the compound having $\Delta ST$ equal to or less than a predetermined value is used. The aforementioned triplet energy EgT is different from a typically defined triplet energy. Such a difference will be described below.

For general measurement of the triplet energy, a target compound to be measured is dissolved in a solvent to form a sample. A phosphorescent spectrum (ordinate axis: phosphorescent luminous intensity, abscissa axis: wavelength) of the sample is measured at a low temperature (77K). A tangent is drawn to the rise of the phosphorescent spectrum on the short-wavelength side. The triplet energy is calculated by a predetermined conversion equation based on a wavelength value at an intersection of the tangent and the abscissa axis.

As described above, the compound used for the first host material in the exemplary embodiment has a small $\Delta ST$. When $\Delta ST$ is small, intersystem crossing and reverse intersystem crossing are likely to occur even at a low temperature (77K), so that the singlet state and the triplet state coexist. As a result, the spectrum to be measured in the same manner as the above includes emission from both the singlet state and the triplet state. Although it is difficult to distinguish emission from the singlet state from emission from the triplet state, the value of the triplet energy is basically considered dominant.

Accordingly, in order to distinguish the triplet energy EgT in the exemplary embodiment from the typical triplet energy EgT in a strict meaning although the measurement method is the same, the triplet energy EgT in the exemplary embodiment is defined as follows. A target compound to be measured is dissolved in a solvent to form a sample. A phosphorescent spectrum (ordinate axis: phosphorescent luminous intensity, abscissa axis: wavelength) of the sample is measured at a low temperature (77K). A tangent is drawn to the rise of the phosphorescent spectrum on the short-wavelength side. Energy is calculated as an energy gap $Eg_{77K}$ by a predetermined conversion equation based on a wavelength value at an intersection of the tangent and the abscissa axis. $\Delta ST$ is defined as a difference between the singlet energy EgS and the energy gap $Eg_{77K}$. Accordingly, $\Delta ST(H1)$ is represented by the above formula (3).

The triplet energy measured in a solution state may include an error by interaction between the target molecule and the solvent. Accordingly, as an ideal condition, a measurement in a thin film state is desired in order to avoid the interaction between the target molecule and the solvent. In this exemplary embodiment, the molecule of the compound used as the first host material exhibits a photoluminescence spectrum having a broad half bandwidth in a solution state, which strongly implies aggregate formation also in the solution state. Accordingly, the solution state is considered to provide the same conditions as in a thin film state. Consequently, in this exemplary embodiment, a measurement value of the triplet energy in the solution state is used.

Singlet Energy EgS

The singlet energy EgS in the exemplary embodiment is defined based on calculation by a typical method. Specifically, the target compound is evaporated on a quartz substrate to prepare a sample. An absorption spectrum (ordinate axis: absorbance, abscissa axis: wavelength) of the sample is measured at a normal temperature (300K). A tangent is drawn to the rise of the absorption spectrum on the long-wavelength side. The singlet energy EgS is calculated by a predetermined conversion equation based on the tangent and the wavelength value at the intersection. EgS in aggregate formation corresponds to an energy gap between S1-m⁻ and the ground state S0 in the Davydov splitting model.

The calculation of the singlet energy EgS and the energy gap $Eg_{77K}$ will be described in detail later.

Delayed Fluorescence Ratio

A delayed fluorescence ratio according to the organic EL device of the exemplary embodiment exceeds the theoretical upper-limit of a delayed fluorescence ratio (TTF ratio) of a case where it is assumed that delayed fluorescence is generated only by the TTF mechanism. In other words, according to the exemplary embodiment, an organic EL device having a higher internal quantum efficiency is achievable.

The delayed fluorescence ratio is measurable by a transitional EL method. The transitional EL method is for measuring reduction behavior (transitional property) of EL emission after pulse voltage applied on the device is removed. EL luminous intensity is classified into a luminescence component from singlet excitons generated in first recombination and a luminescence component from singlet excitons generated through triplet excitons. Since lifetime of the singlet excitons generated in the first recombination is very short at a nano-second order, EL emission from the singlet excitons generated in the first recombination is rapidly reduced after removal of pulse voltage.

On the other hand, since delayed fluorescence provides emission from singlet excitons generated through long-life triplet excitons, EL emission is gradually reduced. Thus, since there is a large difference in time between emission from the singlet excitons generated in the first recombination and emission from the singlet excitons derived from the triplet excitons, a luminous intensity derived from delayed fluorescence is obtainable. Specifically, the luminous intensity can be determined by the following method.

Figure 5:
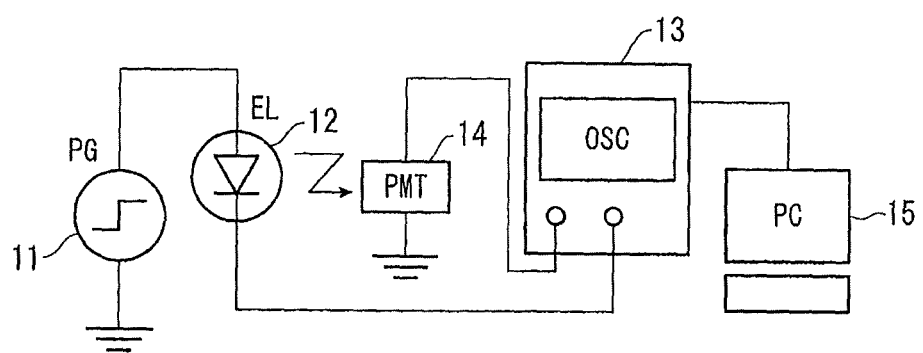
FIG. 5 shows a measurement system of transitional EL waves.

Transitional EL waveform is measured as follows (see FIG. 5). Pulse voltage waveform outputted from a voltage pulse generator (PG) 11 is applied on an organic EL device (EL) 12. The applied voltage waveform is loaded in an oscilloscope (OSC) 13. When pulse voltage is applied on the organic EL device 12, the organic EL device 12 generates pulse emission. This emission is loaded in the oscilloscope (OSC) 13 through a photomultiplier (PMT) 14. The voltage waveform and the pulse emission are synchronized and loaded in a personal computer (PC) 15.

The ratio of luminous intensity derived from delayed fluorescence is defined as follows based on analysis of the transitional EL waveform.

It should be noted that a formula to calculate a TTF ratio described in International Publication No. WO2010/134352 may be used for calculation of the ratio of luminous intensity derived from delayed fluorescence.

It is considered that a delayed fluorescence component defined in the exemplary embodiment includes thermally activated delayed fluorescence (TADF mechanism) described in the exemplary embodiment in addition to the luminescence component derived from TTF. For this reason, in the exemplary embodiment, a ratio of the delayed fluorescence component calculated according to the following numerical formula (14) is referred to as a delayed fluorescence ratio, not as a TTF ratio.

The delayed fluorescence ratio is calculated according to the numerical formula (14).

Numerical Formula 1

$$\frac{1}{\sqrt{I}} \propto A + \gamma \cdot t \qquad (14)$$

In the numerical formula (14), I represents luminous intensity derived from delayed fluorescence. A represents a constant. The measured transitional EL waveform data is fit in the numerical formula (14) to obtain the constant A. Here, a luminous intensity $1/A^2$ at the time t=0 when pulse voltage is removed is defined as the ratio of luminous intensity derived from delayed fluorescence.

Figure 6A:
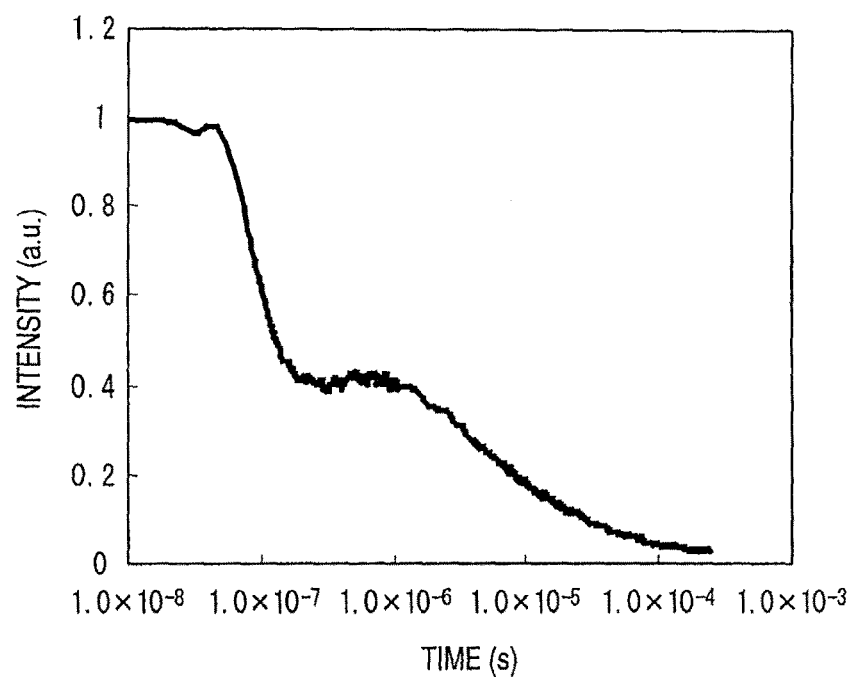
FIG. 6A shows a measurement method of a ratio of luminous intensities derived from delayed fluorescence and is a graph showing time-varying luminous intensities of the EL device.

A graph of FIG. 6(A) shows a measurement example where a predetermined pulse voltage is applied on the organic EL device and then the pulse voltage is removed and shows time-varying luminous intensities of the organic EL device.

The pulse voltage was removed at the time of about $3\times10^{-8}$ seconds in the graph of FIG. 6 (A). In the graph of FIG. 6(A), the luminous intensity when the voltage is removed is defined as 1.

After rapid reduction before the elapse of about $2\times10^{-7}$ seconds after the voltage removal, a gradual reduction component appears.

Figure 6B:
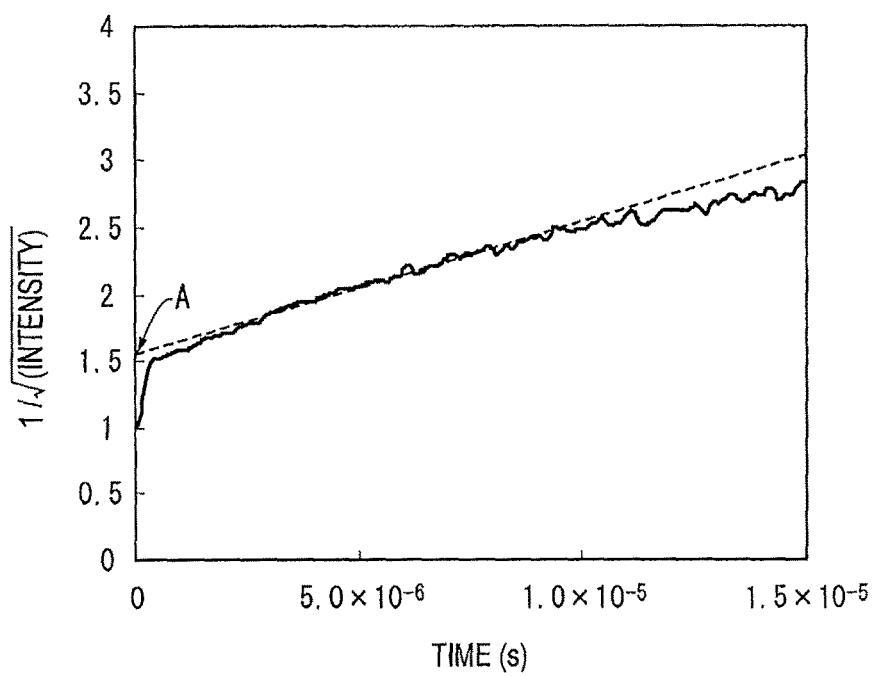
FIG. 6B shows a measurement method of a ratio of luminous intensities derived from delayed fluorescence and is a graph showing time-varying reverse square root of the luminous intensities.

In the graph of FIG. 6(B), the voltage removal time is a starting point and the reverse square root of luminous intensity before the elapse of $1.5\times10^{-5}$ seconds after voltage removal is plotted. Fitting is conducted as follows.

A value at an intersection A of the ordinate axis and the linear line extended to the starting point is 1.55. Accordingly, the ratio of luminous intensity derived from the delayed fluorescence obtained from the transitional EL waveform is $1/(1.55)^2=0.41$, which means 41% of the luminous intensity is derived from the delayed fluorescence. In other words, the ratio of luminous intensity exceeds 37.5%, i.e., the supposed theoretical upper-limit of the TTF ratio.

The luminous intensity derived from the delayed fluorescence obtained from the transitional EL waveform is variable in accordance with measurement temperatures. Such a phenomenon is considered to be inherent mostly in fluorescent emission by the TADF mechanism The luminous intensity is preferably fitted in a linear line by the method of least squares.

In this case, the luminous intensity before the elapse of $10^{-5}$ seconds is preferably fitted.

Figure 7:
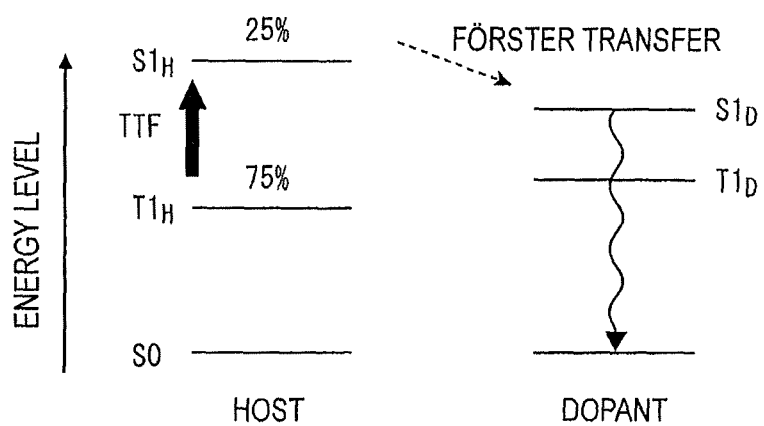
FIG. 7 shows a relationship between energy levels of a host material and a dopant material in an emitting layer.

The TTF mechanism having an emission mechanism by delayed fluorescence will be described using FIG. 7. FIG. 7 shows a relationship in energy level between the host material and the dopant material in an organic EL device using the TTF mechanism. In FIG. 7, S0, $S1_H$, $T1_H$, $S1_D$ and $T1_D$ represent the same as those in FIG. 3. An arrow shows energy transfer between the respective excited states in FIG. 7.

As described above, the TTF mechanism utilizes a phenomenon in which singlet excitons are generated by collision between two triplet excitons. As shown in FIG. 7, it is preferable that the lowest triplet state $T1_H$ of the host material is lower than the lowest triplet state $T1_D$ of the dopant material, so that triplet excitons concentrate on molecules of the host material. The triplet excitons efficiently collide with each other in accordance with increase in the density of the triplet excitons, whereby the triplet excitons are partially changed into singlet excitons. The lowest singlet state $S1_H$ of the host material generated by the TTF mechanism is immediately transferred to the lowest singlet state $S1_D$ of the dopant material by Förster transfer, so that the dopant material emits fluorescence.

The theoretical upper-limit of the TTF ratio can be obtained as follows.

According to S. M. Bachilo et al. (J. Phys. Chem. A, 104, 7711 (2000)), assuming that high-order excitons such as quintet excitons are quickly returned to triplet excitons, triplet excitons (hereinafter abbreviated as $^3A^*$) collide with one another when the density thereof is increased, whereby a reaction shown by the following numerical formula (15) occurs. In the formula, $^1A$ represents the ground state and $^1A^*$ represents the lowest singlet excitons.

Numerical Formula 2

$$^3A^* + {}^3A^* \rightarrow (4/9){}^1A + (1/9){}^1A^* + (13/9){}^3A^* \qquad (15)$$

In other words, $5{}^3A^* \rightarrow 4{}^1A + {}^1A^*$. It is expected that, among triplet excitons initially generated, which account for 75%, one fifth thereof (i.e., 20%) is changed to singlet excitons.

Accordingly, the amount of singlet excitons which contribute to emission is 40%, which is a value obtained by adding 15% (75%×(1/5)=15%) to 25% (the amount ratio of initially generated singlet excitons).

At this time, a ratio of luminous intensity derived from TTF (TTF ratio) relative to the total luminous intensity is 15/40, i.e., 37.5%. Thus, it is recognized that the delayed fluorescence ratio of the organic EL device according to the exemplary embodiment exceeds the theoretical upper-limit of only the TTF ratio.

Residual Intensity Ratio in 1 μs

A method for relatively measuring an amount of delayed fluorescence is exemplified by a method for measuring a residual intensity in 1 μs. The residual intensity in 1 μs is defined as a ratio of a luminous intensity after the elapse of 1 μs after removal of a pulse voltage measured by a transitional EL method to a luminous intensity at the time of the removal of the pulse voltage. The relative amount of delayed fluorescence can be estimated based on reduction behavior of EL emission after the removal of the pulse voltage measured by the transitional EL method. The residual intensity ratio in 1 μs can be obtained by reading luminous intensity at the time of 1.0 μs in the graph of FIG. 6A.

The residual intensity ratio in 1 μs is preferably larger than 36.0%, more preferably 38.0% or more.

ΔT

It is preferable that a difference ΔT between triplet energy $Eg_{77K}(H1)$ of the first host material and triplet energy $Eg_{77K}(D)$ of the dopant material satisfies a relationship represented by the numerical formula (7). ΔT is preferably more than 0.5 eV, more preferably 0.8 eV or more, further preferably 1.0 eV or more.

When ΔT satisfies the relationship represented by the numerical formula (7), energy of the triplet excitons generated by recombination on the first host material becomes difficult to transfer to the triplet level of the dopant material, and thermal deactivation of the triplet excitons becomes difficult. Consequently, the dopant efficiently emits fluorescence.

Compound Used as First Host Material

In a combination of the second host material and the dopant material, the first host material satisfying the numerical formulae (1), (2) to (4) and (6) to (7) is preferably selected from the group consisting of a carbazole derivative, a biscarbazole derivative, an indolocarbazole derivative, an acridine derivative, an oxazine derivative, a pyrazine derivative, a pyrimidine derivative, a triazine derivative, a dibenzofuran derivative, and a dibenzothiophene derivative. These derivatives may have a substituent as needed.

Examples of the substituent include an aryl group having 6 to 40 carbon atoms, a heterocyclic group having 2 to 40 carbon atoms, a trialkylsilyl group, dialkylarylsilyl group, an alkyldiarylsilyl group, a triarylsilyl group, a fluorine atom, and a cyano group. The trialkylsilyl group, the dialkylarylsilyl group, the alkyldiarylsilyl group, and the triarylsilyl group as the substituent contain at least one of an alkyl group having 1 to 30 carbon atoms and an aryl group having 6 to 30 carbon atoms. It should be noted that the aryl group in the substituent also includes a fused aromatic hydrocarbon group and the heterocyclic group in the substituent also includes a fused aromatic heterocyclic group.

The host material is preferably a compound including bonding between at least one selected from a carbazole structure, a biscarbazole structure, an indolocarbazole structure, and an acridine structure and at least one selected from an oxazine structure, a pyrazine structure, a pyrimidine structure, a triazine structure, and a dibenzofuran structure.

Bonding between these structures means bonding by various linking groups. Preferable examples of the linking group are a single bond, a phenylene structure and metabiphenylene structure.

In the exemplary embodiment, the carbazole structure, the indolocarbazole structure, the acridine structure, the oxadine structure, the pyrazine structure, the pyrimidine structure, the triazine structure, and the dibenzofuran structure respectively refer to cyclic structures containing indolocarbazole, acridine, oxadine, pyrazine, pyrimidine, triazine, and dibenzofuran as a partial structure.

The carbazole structure, the biscarbazole structure, the indolocarbazole structure, the acridine structure, the oxazine structure, the pyrazine structure, the pyrimidine structure, the triazine structure, and the dibenzofuran structure may have a substituent as needed.

Examples of the substituent include an aryl group having 6 to 40 carbon atoms, a heterocyclic group having 2 to 40 carbon atoms, a trialkylsilyl group, dialkylarylsilyl group, an alkyldiarylsilyl group, a triarylsilyl group, a fluorine atom, and a cyano group. The trialkylsilyl group, the dialkylarylsilyl group, the alkyldiarylsilyl group, and the triarylsilyl group as the substituent contain at least one of an alkyl group having 1 to 30 carbon atoms and an aryl group having 6 to 30 carbon atoms.

In the exemplary embodiment of the invention, a "hydrogen atom" means isotopes having different neutron numbers and specifically encompasses protium, deuterium and tritium.

Since the first host material is a compound in which a donor element is bonded to an acceptor element in a molecule, the first host material is preferably a biscarbazole derivative represented by the following formula (101).

[Formula 1]

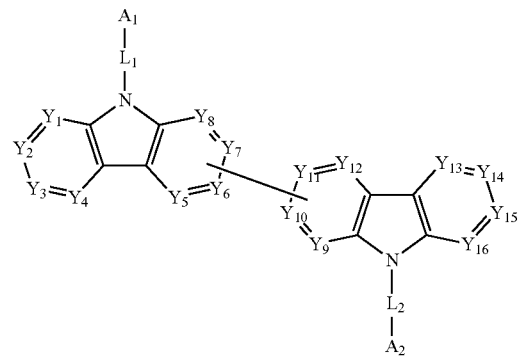

(101)

In the above formula (101), $A_1$ and $A_2$ each independently represent a hydrogen atom, a halogen atom, a cyano group, a substituted or unsubstituted aromatic hydrocarbon group having 6 to 30 ring atoms, a substituted or unsubstituted aromatic heterocyclic group having 2 to 30 ring carbon atoms, a substituted or unsubstituted alkyl group having 1 to 30 carbon atoms, a substituted or unsubstituted cycloalkyl group having 3 to 30 ring carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, or a substituted or unsubstituted silyl group.

However, it is preferable that at least one of $A_1$ and $A_2$ is a cyano group.

It should be noted that, in $A_1$ and $A_2$, the aromatic hydrocarbon group includes a fused aromatic hydrocarbon group and the aromatic heterocyclic group includes a fused aromatic heterocyclic group.

In the above formula (101), $Y_1$ to $Y_4$ and $Y_{13}$ to $Y_{16}$ independently represent C(R) or a nitrogen atom. $Y_5$ to $Y_8$ independently represent C(R), a nitrogen atom or a carbon atom to be bonded to one of $Y_9$ to $Y_{12}$. $Y_9$ to $Y_{12}$ independently represent C(R), a nitrogen atom or a carbon atom to be bonded to one of $Y_5$ to $Y_8$. R independently represent a hydrogen atom or a substituent. The substituent in R is the same as the substituent described for the above first host material.

$L_1$ and $L_2$ in the above formula (101) each independently represent a single bond, a substituted or unsubstituted divalent aromatic hydrocarbon group having 6 to 30 ring carbon atoms, a substituted or unsubstituted divalent aromatic heterocyclic group having 2 to 30 ring atoms, or a group formed by bonding the above divalent aromatic hydrocarbon group and the above divalent aromatic heterocyclic group.

It should be noted that, in $L_1$ and $L_2$, the aromatic hydrocarbon group includes a fused aromatic hydrocarbon group and the aromatic heterocyclic group includes a fused aromatic heterocyclic group.

At least one of $L_1$ and $L_2$ is preferably represented by a formula (a) below.

[Formula 2]

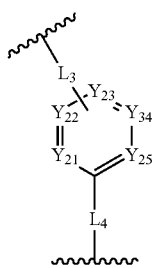

(a)

In the above formula (a), $Y_{21}$ to $Y_{25}$ each independently represent $C(R_a)$, a nitrogen atom or a carbon atom to be bonded to $L_3$, in which $R_a$ independently represents a hydrogen atom or a substituent. The substituent in $R_a$ is the same as the substituent described for the above first host material.

$L_3$ and $L_4$ in the above formula (a) each independently represent a single bond, a substituted or unsubstituted divalent aromatic hydrocarbon group having 6 to 30 ring carbon atoms, a substituted or unsubstituted divalent aromatic heterocyclic group having 2 to 30 ring atoms, or a group formed by bonding the above divalent aromatic hydrocarbon group and the above divalent aromatic heterocyclic group.

It should be noted that, in $L_3$ and $L_4$, the aromatic hydrocarbon group includes a fused aromatic hydrocarbon group and the aromatic heterocyclic group includes a fused aromatic heterocyclic group.

Second Host Material

In the exemplary embodiment, the second host material is a compound having a fused aromatic hydrocarbon group having 10 to 30 ring carbon atoms or a fused aromatic heterocyclic group having 8 to 30 ring atoms.

The second host material is exemplified by an anthracene derivative represented by the following formula (20A), (20B), (20C), (20D) or (20E). However, the invention is not limited by the anthracene derivative having these structures.

[Formula 3]

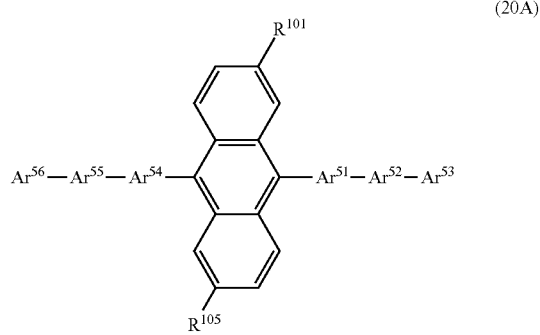

(20A)

In the formula (20A), $R^{101}$ and $R^{105}$ each independently represent a hydrogen atom, halogen atom, cyano group, substituted or unsubstituted monocyclic group having 5 to 30 ring atoms, substituted or unsubstituted fused cyclic group having 8 to 30 ring atoms, a group provided by combining a monocyclic group and a fused cyclic group, substituted or unsubstituted alkyl group having 1 to 30 carbon atoms, substituted or unsubstituted cycloalkyl group having 3 to 30 ring carbon atoms, substituted or unsubstituted alkoxy group having 1 to 30 carbon atoms, substituted or unsubstituted aralkyl group having 7 to 30 carbon atoms, substituted or unsubstituted aryloxy group having 6 to 30 ring carbon atoms, or substituted or unsubstituted silyl group.

In the formula (20A), $Ar^{51}$ and $Ar^{54}$ each independently represent a substituted or unsubstituted divalent monocyclic residue having 5 to 30 ring atoms, or substituted or unsubstituted divalent fused cyclic residue having 8 to 30 ring atoms.

In the formula (20A), $Ar^{52}$ and $Ar^{55}$ each independently represent a single bond, substituted or unsubstituted divalent monocyclic residue having 5 to 30 ring atoms, or substituted or unsubstituted divalent fused cyclic residue having 8 to 30 ring atoms.

In the formula (20A), $Ar^{53}$ and $Ar^{56}$ each independently represent a hydrogen atom, substituted or unsubstituted monocyclic group having 5 to 30 ring atoms, or substituted or unsubstituted fused cyclic group having 8 to 30 ring atoms.

[Formula 4]

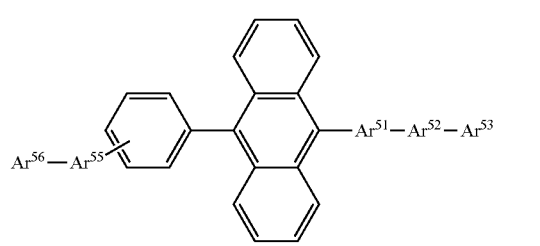

(20B)

In the formula (20B), $Ar^{51}$ represents a substituted or unsubstituted divalent monocyclic residue having 5 to 30 ring atoms, or substituted or unsubstituted divalent fused cyclic residue having 8 to 30 ring atoms.

In the formula (20B), $Ar^{52}$ and $Ar^{55}$ each independently represent a single bond, substituted or unsubstituted divalent monocyclic residue having 5 to 30 ring atoms, or substituted or unsubstituted divalent fused cyclic residue having 8 to 30 ring atoms.

In the formula (20B), $Ar^{53}$ and $Ar^{56}$ each independently represent a hydrogen atom, substituted or unsubstituted monocyclic group having 5 to 30 ring atoms, or substituted or unsubstituted fused cyclic group having 8 to 30 ring atoms.

[Formula 5]

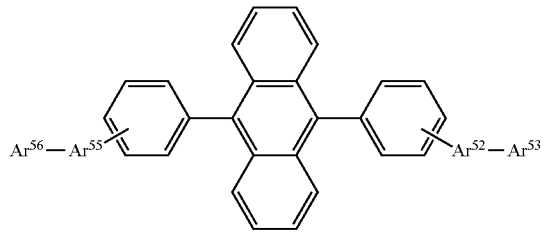

(20C)

In the formula (20C), $Ar^{52}$ represents a substituted or unsubstituted divalent monocyclic residue having 5 to 30 ring atoms, or substituted or unsubstituted divalent fused cyclic residue having 8 to 30 ring atoms.

In the formula (20C), $Ar^{55}$ represents a single bond, substituted or unsubstituted divalent monocyclic residue having 5 to 30 ring atoms, or substituted or unsubstituted divalent fused cyclic residue having 8 to 30 ring atoms.

In the formula (20C), $Ar^{53}$ and $Ar^{56}$ each independently represent a hydrogen atom, substituted or unsubstituted monocyclic group having 5 to 30 ring atoms, or substituted or unsubstituted fused cyclic group having 8 to 30 ring atoms.

[Formula 6]

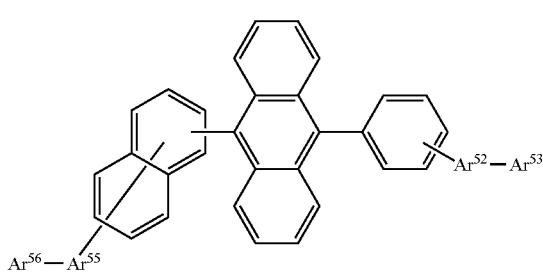

(20D)

In the formula (20D), $Ar^{52}$ represents a substituted or unsubstituted divalent monocyclic residue having 5 to 30 ring atoms, or substituted or unsubstituted divalent fused cyclic residue having 8 to 30 ring atoms.

In the formula (20D), $Ar^{55}$ represents a single bond, substituted or unsubstituted divalent monocyclic residue having 5 to 30 ring atoms, or substituted or unsubstituted divalent fused cyclic residue having 8 to 30 ring atoms.

In the formula (20D), $Ar^{53}$ and $Ar^{56}$ each independently represent a hydrogen atom, substituted or unsubstituted monocyclic group having 5 to 30 ring atoms, or substituted or unsubstituted fused cyclic group having 8 to 30 ring atoms.

[Formula 7]

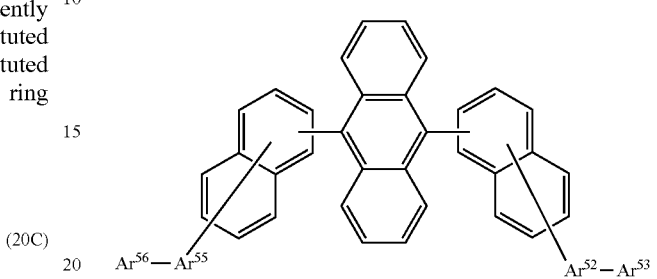

(20E)

In the formula (20E), $Ar^{52}$ and $Ar^{55}$ each independently represent a single bond, substituted or unsubstituted divalent monocyclic residue having 5 to 30 ring atoms, or substituted or unsubstituted divalent fused cyclic residue having 8 to 30 ring atoms.

In the formula (20E), $Ar^{53}$ and $Ar^{56}$ each independently represent a hydrogen atom, substituted or unsubstituted monocyclic group having 5 to 30 ring atoms, or substituted or unsubstituted fused cyclic group having 8 to 30 ring atoms.

The monocyclic group in the formulae (20A), (20B), (20C), (20D) and (20E) refers to a group only having a cyclic structure without a fused structure.

The monocyclic group has 5 to 30 ring atoms, preferably 5 to 20 ring atoms. Examples of the monocyclic group are: an aromatic group such as a phenyl group, biphenyl group, terphenyl group, and quarterphenyl group; and a heterocyclic group such as a pyridyl group, pyrazyl group, pyrimidyl group, triazinyl group, furyl group, and thienyl group. Among the monocyclic group, a phenyl group, biphenyl group and terphenyl group are preferable.

The fused cyclic group in the formulae (20A), (20B), (20C), (20D) and (20E) is a group obtained by fusing two or more cyclic structures.

The fused cyclic group has 8 to 30 ring atoms, preferably 8 to 20 ring atoms. Examples of the fused cyclic group are: a fused aromatic ring group such as a naphthyl group, phenanthryl group, anthryl group, chrysenyl group, benzanthryl group, benzophenanthryl group, triphenylenyl group, benzochrysenyl group, indenyl group, fluorenyl group, 9,9-dimethylfluorenyl group, benzofluorenyl group, dibenzofluorenyl group, fluoranthenyl group, and benzofluoranthenyl group; and a fused heterocyclic group such as a benzofuranyl group, benzothiophenyl group, indolyl group, dibenzofuranyl group, dibenzothiophenyl group, carbazolyl group, quinolyl group, and phenanthrolinyl group. Among the fused cyclic groups, a naphthyl group, phenanthryl group, anthryl group, 9,9-dimethylfluorenyl group, fluoranthenyl group, benzoanthryl group, dibenzothiophenyl group, dibenzofuranyl group and carbazolyl group are preferable.

Among the second host material to be combined with the first host material and the dopant material, a compound satisfying the above numerical formulae (2), (5) and (6) is preferable.

Dopant Material

A preferable dopant in the exemplary embodiment has properties to emit fluorescence and to have a large speed constant of radiational transition. In this arrangement, singlet excitons electrically excited on the host material, singlet excitons generated by the TADF mechanism and the like are transferred to singlet excitons of the dopant material by Förster energy transfer and the dopant material immediately emits light. In other words, fluorescent emission is possible through the above energy transition before triplet excitons on the host material causes TTA, by which decrease in an efficiency in the high current density range is likely to be considerably improved.

It is preferable to select a dopant material having a fluorescence lifetime of 5 ns or less, more preferably 2 ns or less as the dopant material having a large speed constant of radiational transition in the exemplary embodiment. A fluorescence quantum efficiency of the dopant material is preferably 80% or more in a solution. The fluorescence quantum efficiency can be obtained by measuring the dopant material in a range of $10^{-5}$ to $10^{-6}$ mol/l of a concentration in a toluene solution using Absolute PL Quantum Yield Measurement System C9920-02 manufactured by HAMAMATSU PHOTONICS K.K.

It is also expected by measuring an EL spectrum of the device and confirming a Luminescence Component of a Material Other than the Dopant Material is 1/10 or Less of the luminescence component of the dopant that the dopant material has a large speed constant of radiational transition.

Compound Used as Dopant Material

The dopant material may be a non-heavy-metal complex, i.e., a fluorescent dopant material. Examples of the dopant material include a naphthalene derivative, an anthracene derivative, a pyrene derivative, a chrysene derivative, a fluoranthene derivative, an indenoperylene derivative, a pyrromethene-boron complex compound, a compound having a pyrromethene skeleton or a metal complex thereof, a diketopyrolopyrrol derivative, and a perylene derivative.

Examples of the naphthalene derivative include a bisarylaminonaphthalene derivative and an aryl-substituted naphthalene derivative. Examples of the anthracene derivative include a bisarylaminoanthracene derivative and an aryl-substituted anthracene derivative. Examples of the pyrene derivative include a bisarylaminopyrene derivative and an aryl-substituted pyrene derivative. Examples of the chrysene derivative include a bisarylaminochrysene derivative and an aryl-substituted chrysene derivative.

The fluoranthene derivative is exemplified by compounds represented by formulae (2) to (18) below.

[Formula 8]

(2)

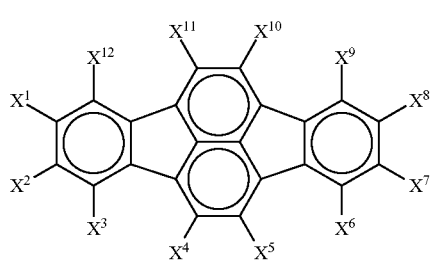

(3)

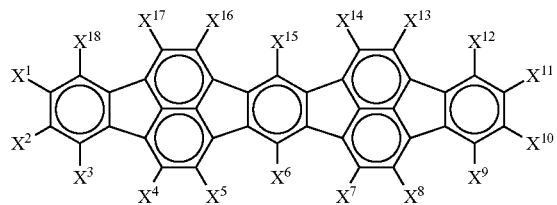

(4)

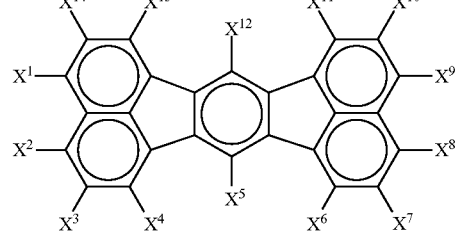

(5)

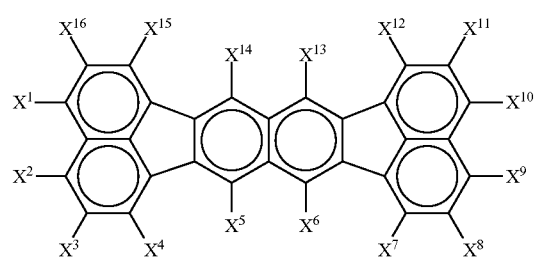

(6)

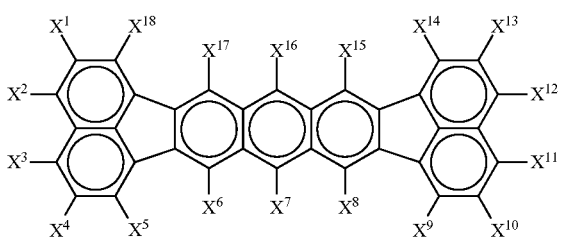

[Formula 9]

(7)

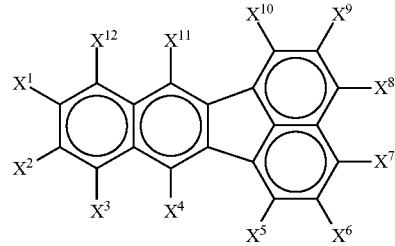

(8)

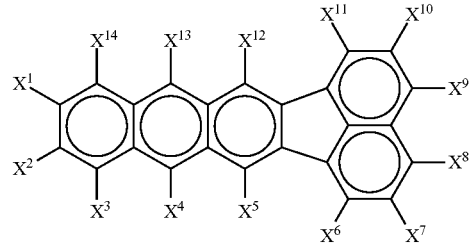

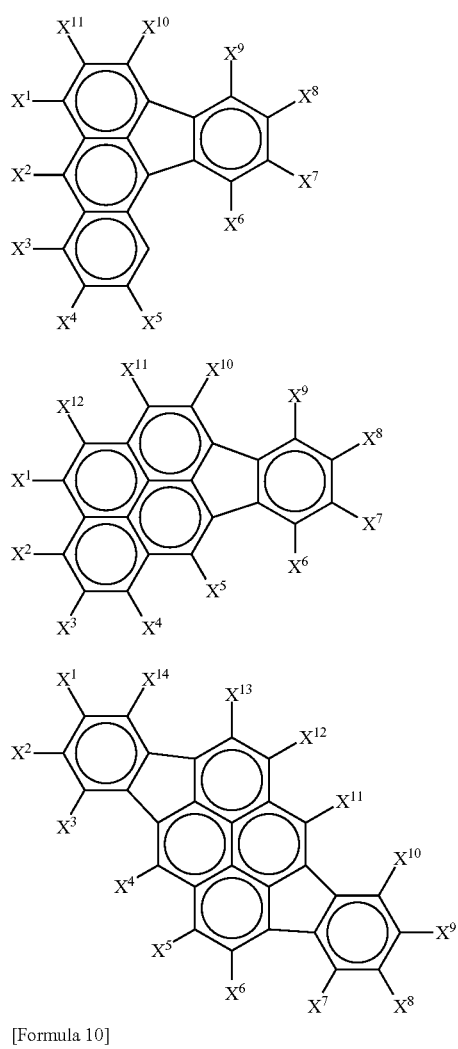

[Formula 10]

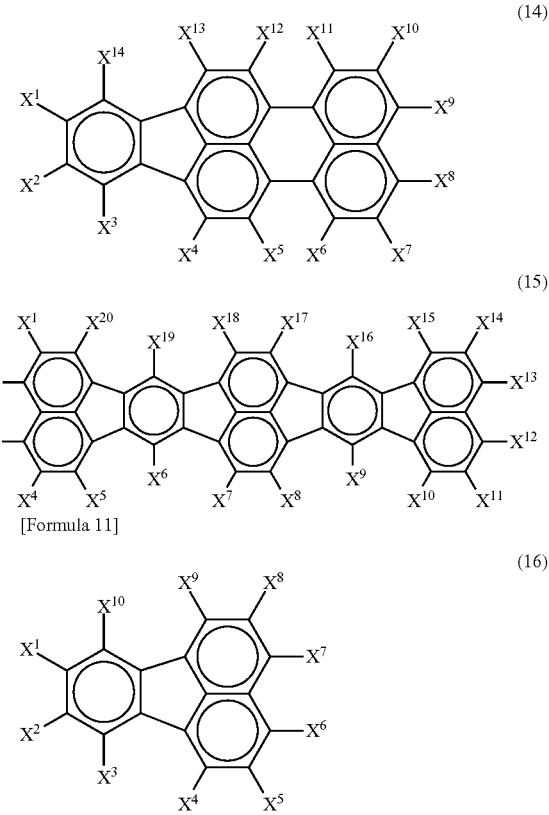

[Formula 11]

[Formula 12]

In the formulae (2) to (16), $X^1$ to $X^{20}$ each independently represent a hydrogen atom, a linear, branched or cyclic alkyl group having 1 to 20 carbon atoms, a linear, branched or cyclic alkoxy group having 1 to 20 carbon atoms, a substituted or unsubstituted aryl group having 6 to 30 carbon atoms, a substituted or unsubstituted aryloxy group having 6 to 30 carbon atoms, a substituted or unsubstituted arylamino group having 6 to 30 carbon atoms, a substituted or unsubstituted alkylamino group having 1 to 30 carbon atoms, a substituted or unsubstituted arylalkylamino group having 7 to 30 carbon atoms, or a substituted or unsubstituted alkenyl group having 8 to 30 carbon atoms.

The adjacent substituents and $X^1$ to $X^{20}$ may be bonded together to form a cyclic structure.

Further, the adjacent substituents, each of which is the aryl group, may be the same with each other.

The compounds of formulae (2) to (16) each preferably contain an amino group or an alkenyl group, more preferably are represented by formulae (17) to (18) below.

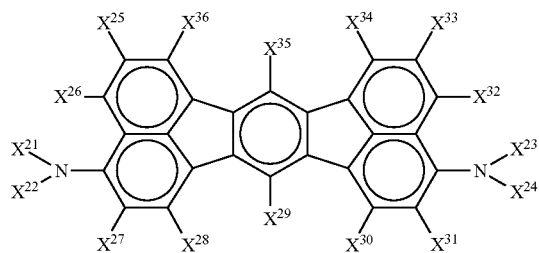

(18)

In the formulae (17) and (18), $X^{21}$ to $X^{24}$ each independently represent an alkyl group having 1 to 20 carbon atoms or a substituted or unsubstituted aryl group having 6 to 30 carbon atoms.

$X^{21}$ and $X^{22}$ may be bonded by a carbon-carbon bond or through —O— and —S—.

$X^{23}$ and $X^{24}$ may be bonded by a carbon-carbon bond or through —O— and —S—.

$X^{25}$ to $X^{36}$ represent a hydrogen atom, a linear, branched or cyclic alkyl group having 1 to 20 carbon atoms, a linear, branched or cyclic alkoxy group having 1 to 20 carbon atoms, a substituted or unsubstituted aryl group having 6 to 30 carbon atoms, a substituted or unsubstituted aryloxy group having 6 to 30 carbon atoms, a substituted or unsubstituted arylamino group having 6 to 30 carbon atoms, a substituted or unsubstituted alkylamino group having 1 to 30 carbon atoms, a substituted or unsubstituted arylalkylamino group having 7 to 30 carbon atoms, or a substituted or unsubstituted alkenyl group having 8 to 30 carbon atoms.

The adjacent substituents and $X^{25}$ to $X^{36}$ may be bonded together to form a cyclic structure.

At least one of the substituents $X^{25}$ to $X^{36}$ in the above formulae is preferably amine or an alkenyl group.

A fluorescent compound having a fluoranthene skeleton preferably contains an electron-donating group in order to achieve a high efficiency and a long lifetime. The electron-donating group is preferably a substituted or unsubstituted arylamino group. Further, the fluorescent compound having a fluoranthene skeleton preferably has 5 or more fused rings, particularly preferably 6 or more fused rings.

Figure 8:
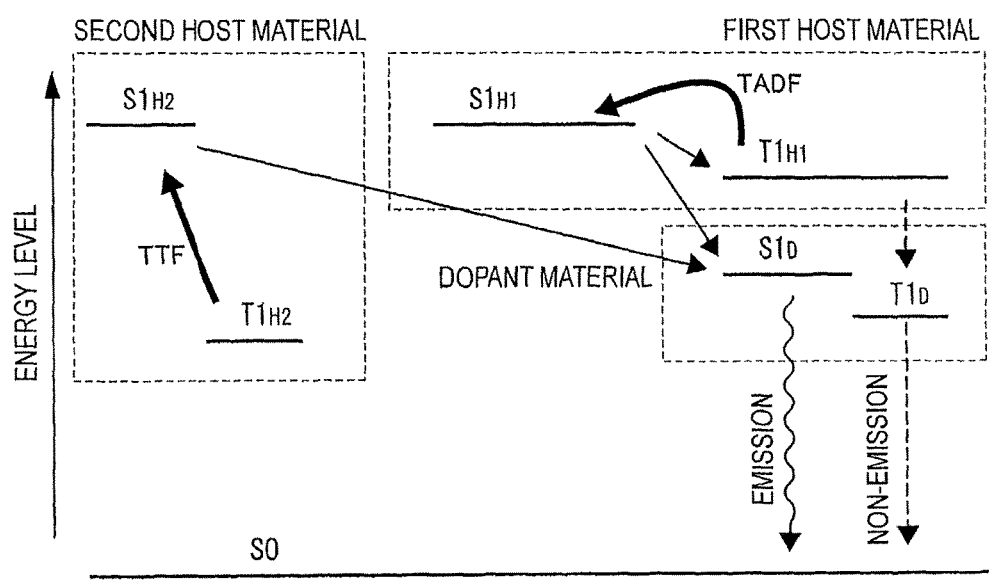
FIG. 8 shows a relationship among energy levels of a first material, a second material and a third material in the emitting layer.

Relationship in Energy Level Among First Host Material, Second Host Material and Dopant Material FIG. 8 shows a relationship in energy level among the first host material, the second and the dopant material in the emitting layer of the exemplary embodiment.

In FIG. 8: S0 represents a ground state; $S1_{H1}$ represents the lowest singlet state of the first host material; $T1_{H1}$ represents the lowest triplet state of the first host material; $S1_{H2}$ represents the lowest singlet state of the second host material; $T1_{H2}$ represents the lowest triplet state of the second host material; $S1_D$ represents the lowest singlet state of the dopant material; and $T1_{H1}$ represents the lowest triplet state of the dopant material. As shown in FIG. 3, a difference between $S1_{H1}$ and $T1_{H1}$ corresponds to $\Delta ST(H1)$, a difference between $S1_{H1}$ and S0 corresponds to EgS(H1), a difference between $S1_D$ and S0 corresponds to EgS(D), and a difference between $T1_D$ and $T1_{H1}$ corresponds to $\Delta T$. In FIG. 8: a solid arrow shows energy transfer between the states; a wavy arrow shows deactivation of energy with emission; and a dotted-line arrow shows deactivation of energy without emission.

As shown in FIG. 8, both of the TTF mechanism and the TADF mechanism are considered to exist in the emission mechanism of the exemplary embodiment. In the first host material, a sufficiently small $\Delta ST(H1)$ causes energy transfer by the TADF mechanism. Specifically, triplet excitons decay through reverse intersystem crossing from the lowest triplet state $T1_{H1}$ to the lowest singlet state $S1_{H1}$, in which energy is transferred to the lowest singlet state $S1_D$ of the dopant material by Förster transfer. An internal quantum efficiency by this mechanism is theoretically 100%. In the second host material, energy is transferred using the TTF mechanism. Specifically, energy is transferred from the lowest singlet state $S1_{H2}$ to the lowest singlet state $S1_D$ of the dopant material by Förster transfer, so that fluorescent emission can be obtained. An internal quantum efficiency by this mechanism is theoretically 40%.

Accordingly, in the emitting layer including the first host material and the second host material in a mass ratio of 50:50, emission derived from the first host material amounts to 50% and emission derived from the second host material amounts to 20%, reaching totally theoretically 70% of the internal quantum efficiency.

Moreover, as shown in FIG. 8, when the lowest triplet state $T1_{H2}$ of the second host material is lower than the lowest triplet state $T1_D$ of the dopant material (i.e., the above numerical formula (5) is satisfied), energy is transferred from the lowest triplet state $T1_D$ to the lowest triplet state $T1_{H2}$, so that the TTF mechanism can be more efficiently caused in the second host material.

Relationship Between Emitting Layer and Electron Transporting Layer

When $\Delta ST(H1)$ of the first host material is small, the energy difference between the first host material and the electron transporting layer adjacent to the emitting layer is small, so that the electrons are likely to be injected into the emitting layer. As a result, carrier balance is easily obtainable to decrease roll-off.

Relationship Between Emitting Layer and Hole Transporting Layer

When an ionization potential of the hole transporting layer is represented by $IP_{HT}$, $IP_{HT} \leq 5.7$ eV is preferable. With this arrangement, balance between the electrons and the holes can be enhanced. The ionization potential can be obtained, for instance, by measuring the material in a form of a thin film using a photoelectron spectroscopy (AC-3: manufactured by RIKEN KEIKI Co., Ltd.).

Half Bandwidth

A half bandwidth represents a width of an emission spectrum when a luminous intensity becomes half relative to the maximum luminous intensity of the emission spectrum. The inventors found that a host material having 50 nm or more of a half bandwidth of a photoluminescence spectrum is a material easily forming an aggregate state and easily causing inverse intersystem crossing in a thin film. Accordingly, the TADF mechanism easily works in the host material having 50 nm or more of the half bandwidth of the photoluminescence spectrum. Particularly preferably, the half bandwidth of the photoluminescence spectrum of the host material is 65 nm or more.

The thickness of the emitting layer is preferably in a range from 5 nm to 50 nm, more preferably from 7 nm to 50 nm, the most preferably from 10 nm to 50 nm. The thickness of less than 5 nm may cause difficulty in forming the emitting layer and in controlling chromaticity, while the thickness of more than 50 nm may raise drive voltage.

In the emitting layer, a ratio of the first host material to the second host material is preferably in a range of 80:20 to 20:80 at a mass ratio. Moreover, a ratio of the first and second host materials (i.e., the host materials in total) to the fluorescent dopant material is preferably in a range of 99:1 to 50:50 at a mass ratio.

Substrate

The organic EL device according to the exemplary embodiment is formed on a light-transmissive substrate. The light-transmissive substrate supports an anode, an organic compound layer, a cathode and the like of the organic EL device. The light-transmissive substrate is preferably a smoothly-shaped substrate that transmits 50% or more of light in a visible region of 400 nm to 700 nm.

The light-transmissive plate is exemplarily a glass plate, a polymer plate or the like.

The glass plate is formed of soda-lime glass, barium/strontium-containing glass, lead glass, aluminosilicate glass, borosilicate glass, barium borosilicate glass, quartz and the like.

The polymer plate is formed of polycarbonate, acryl, polyethylene terephthalate, polyether sulfide, polysulfone and the like.

Anode and Cathode

The anode of the organic EL device injects holes into the emitting layer, so that it is efficient that the anode has a work function of 4.5 eV or more.

Exemplary materials for the anode are indium-tin oxide (ITO), tin oxide (NESA), indium zinc oxide, gold, silver, platinum and copper.

When light from the emitting layer is to be emitted through the anode, the anode preferably transmits more than 10% of the light in the visible region. Sheet resistance of the anode is preferably several hundreds Ω/square or lower. Although depending on the material of the anode, the thickness of the anode is typically in a range of 10 nm to 1 µm, preferably in a range of 10 nm to 200 nm.

The cathode is preferably formed of a material with smaller work function in order to inject electrons into the emitting layer.

Although a material for the cathode is subject to no specific limitation, examples of the material are indium, aluminum, magnesium, alloy of magnesium and indium, alloy of magnesium and aluminum, alloy of aluminum and lithium, alloy of aluminum, scandium and lithium, and alloy of magnesium and silver.

Like the anode, the cathode may be made by forming a thin film on, for instance, the electron transporting layer and the electron injecting layer by a method such as vapor deposition. In addition, the light from the emitting layer may be emitted through the cathode. When light from the emitting layer is to be emitted through the cathode, the cathode preferably transmits more than 10% of the light in the visible region.

Sheet resistance of the cathode is preferably several hundreds Ω per square or lower.

The thickness of the cathode is typically in the range of 10 nm to 1 E, and preferably in the range of 50 nm to 200 nm, though it depends on the material of the cathode.

Hole Injecting/Transporting Layer

The hole injection/transport layer helps injection of holes to the emitting layer and transport the holes to an emitting region. A compound having a large hole mobility and a small ionization energy is used as the hole injection/transport layer.

A material for forming the hole injection/transport layer is preferably a material of transporting the holes to the emitting layer at a lower electric field intensity. For instance, an aromatic amine compound is preferably used.

Electron Injecting/Transporting Layer

The electron injecting/transporting layer helps injection of the electrons into the emitting layer and transports the electrons to an emitting region. A compound having a large electron mobility is used as the electron injecting/transporting layer.

A preferable example of the compound used as the electron injecting/transporting layer is an aromatic heterocyclic compound having at least one heteroatom in a molecule. Particularly, a nitrogen-containing cyclic derivative is preferable. The nitrogen-containing cyclic derivative is preferably a heterocyclic compound having a nitrogen-containing six-membered or five-membered ring skeleton.

In the organic EL device in the exemplary embodiment, in addition to the above exemplary compounds, any compound selected from compounds used in a typical organic El device is usable as a compound for the organic compound layer other than the emitting layer.

Layer Formation Method(s)

A method for forming each layer of the organic EL device in the exemplary embodiment is subject to no limitation except for the above particular description. However, known methods of dry film-forming such as vacuum deposition, sputtering, plasma or ion plating and wet film-forming such as spin coating, dipping, flow coating or ink jet are applicable.

MODIFICATION(S) OF EMBODIMENT(S)

It should be noted that the invention is not limited to the above exemplary embodiment but may include any modification and improvement as long as such modification and improvement are compatible with the invention.

The emitting layer is not limited to a single layer, but may be provided as laminate by a plurality of emitting layers. When the organic EL device includes the plurality of emitting layers, it is only required that at least one of the emitting layers includes the first host material, the second host material and the fluorescent dopant material defined in the exemplary embodiment. The others of the emitting layers may be either a fluorescent emitting layer or a phosphorescent emitting layer.

When the organic EL device includes the plurality of emitting layers, the plurality of emitting layers may be adjacent to each other.

Further, the materials and treatments for practicing the invention may be altered to other arrangements and treatments as long as such other arrangements and treatments are compatible with the invention.

EXAMPLES

Examples of the invention will be described below. However, the invention is not limited by these Examples.

The used compounds were as follows:

[Formula 13]

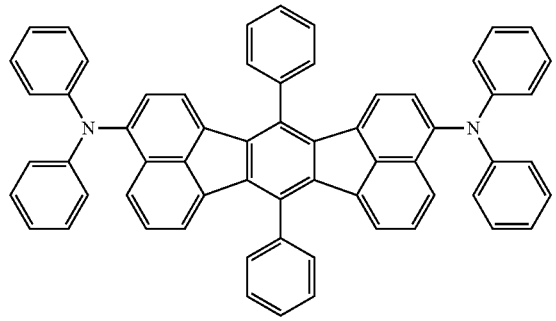

YD-1

-continued
BD-1
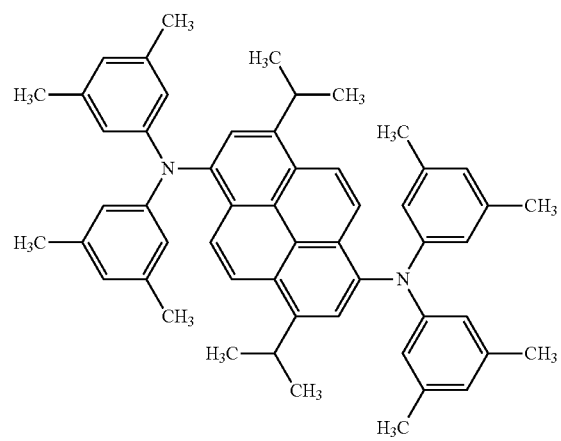
H2-1
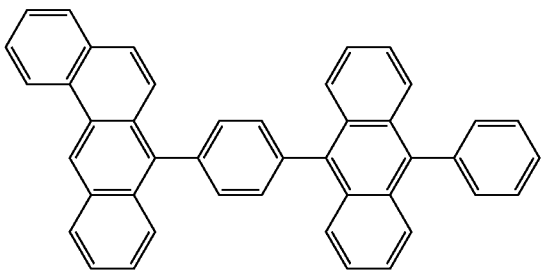
H2-2
H1-1
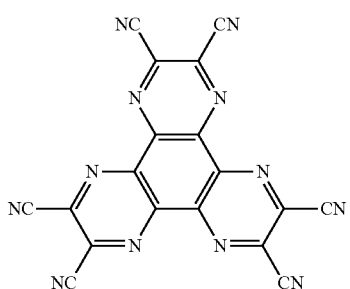
[Formula 14]
HA-1
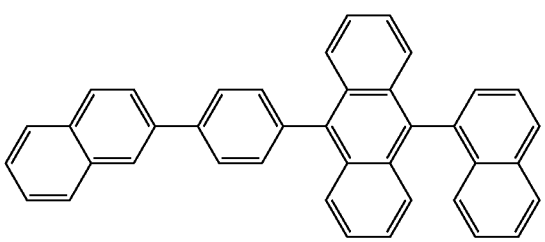
H1-2
HT-1
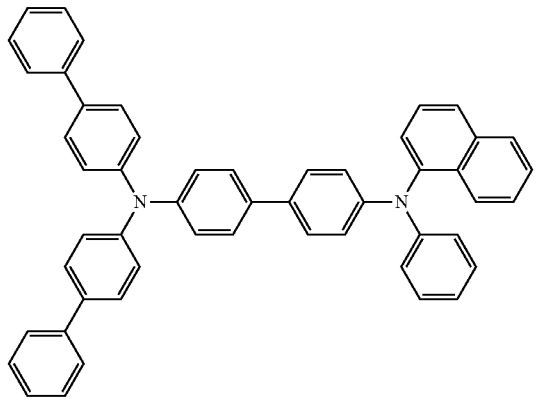

HT-2

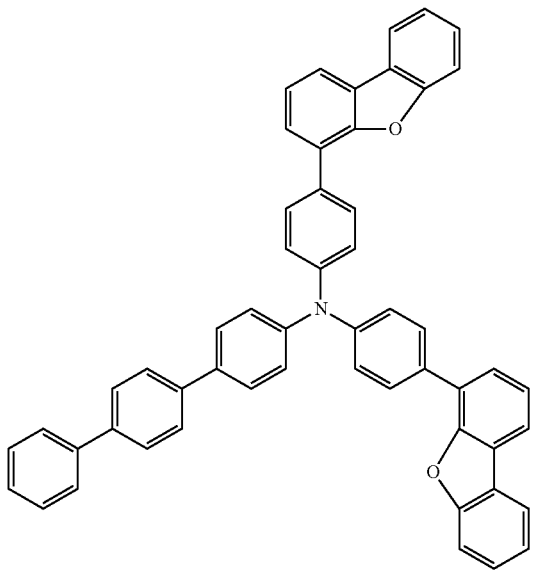

ET-1

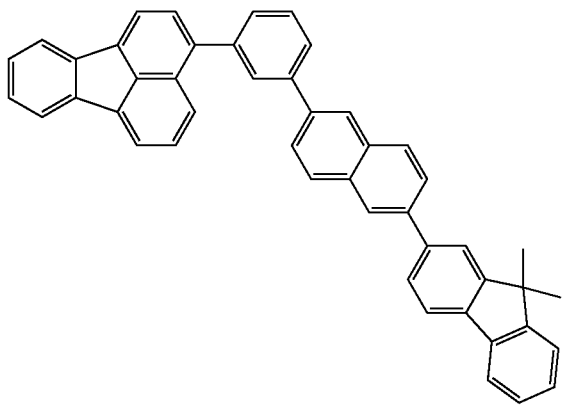

ET-2

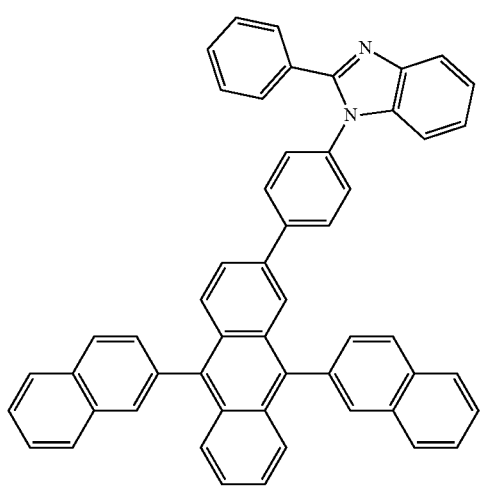

ET-3

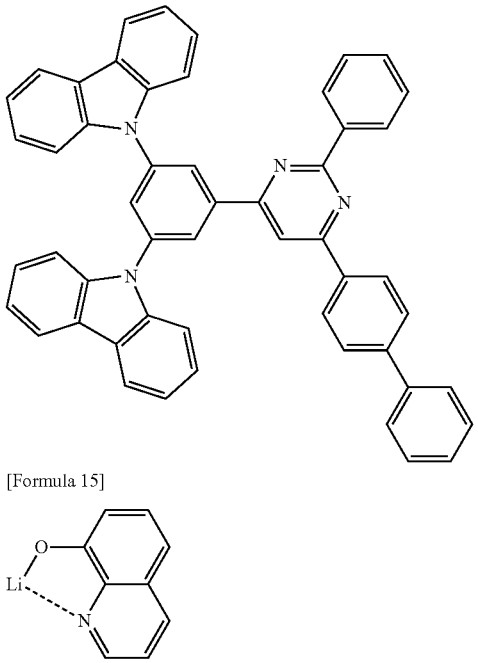

[Formula 15]

Liq

Evaluation of Compounds

Next, properties of the compounds used in Examples were measured. A measurement method and a calculation method are described below. Measurement results and calculation results are shown in Table 1.

(Measurement 1) Singlet Energy EgS

Singlet Energy EgS was obtained by the following method.

A target compound to be measured was deposited on a quartz substrate to prepare a sample. An absorption spectrum of the sample was measured at a normal temperature (300K). A sample was 100 nm thick. The absorption spectrum was expressed in coordinates of which ordinate axis indicated absorbance and of which abscissa axis indicated the wavelength. A tangent was drawn to the fall of the absorption spectrum on the long-wavelength side, and a wavelength value λ edge (nm) at an intersection of the tangent and the abscissa axis was obtained. The wavelength value was converted to an energy value by the following conversion equation. The energy value was defined as EgS.

The conversion equation:
$$EgS\ (eV) = 1239.85/\lambda edge$$

For the measurement of the absorption spectrum, a spectrophotometer (U3310 manufactured by Hitachi, Ltd.) was used.

The tangent to the fall of the absorption spectrum on the long-wavelength side was drawn as follows. While moving on a curve of the absorption spectrum from the maximum spectral value closest to the long-wavelength side in a long-wavelength direction, a tangent at each point on the curve is checked. An inclination of the tangent is decreased and increased in a repeated manner as the curve falls (i.e., a value of the ordinate axis is decreased). A tangent drawn at a point of the minimum inclination closest to the long-wavelength side (except when absorbance is 0.1 or less) is defined as the tangent to the fall of the absorption spectrum on the long-wavelength side.

The maximum absorbance of 0.2 or less was not included in the above-mentioned maximum absorbance on the long-wavelength side.

(Measurement 2) Energy Gap $Eg_{77K}$ and Triplet Energy $EgT_D$ $Eg_{77K}$ and $EgT_D$ were obtained by the following method.

Each of the compounds was measured by a known method of measuring phosphorescence (e.g. a method described in "Hikarikagaku no Sekai (The World of Photochemistry)" (edited by The Chemical Society of Japan, 1993, on and near page 50). Specifically, each of the compounds was dissolved in a solvent (sample: 10 μmol/L, EPA (diethylether:isopentane:ethanol 5:5:2 in volume ratio, each solvent in a spectroscopic grade), thereby forming a sample for phosphorescence measurement. The sample for phosphorescence measurement was put into a quartz cell, cooled to 77K and irradiated with excitation light, so that phosphorescence intensity was measured while changing a wavelength. The phosphorescence spectrum was expressed in coordinates of which ordinate axis indicated phosphorescence intensity and of which abscissa axis indicated the wavelength.

A tangent was drawn to the rise of the phosphorescent spectrum on the short-wavelength side, and a wavelength value λ edge (nm) at an intersection of the tangent and the abscissa axis was obtained. The wavelength value was converted to an energy value by the following conversion equation. The energy value was defined as $Eg_{77K}(H)$ or $EgT_D$ ($Eg_{77K}(D)$).

The conversion equation: $Eg_{77K}(H)(eV) = 1239.85/\lambda$ edge $EgT_D[eV] = 1239.85/\lambda$ edge The tangent to the rise of the phosphorescence spectrum on the short-wavelength side was drawn as follows. While moving on a curve of the phosphorescence spectrum from the short-wavelength side to the maximum spectral value closest to the short-wavelength side among the maximum spectral values, a tangent is checked at each point on the curve toward the long-wavelength of the phosphorescence spectrum. An inclination of the tangent is increased as the curve rises (i.e., a value of the ordinate axis is increased). A tangent drawn at a point of the maximum inclination was defined as the tangent to the rise of the phosphorescence spectrum on the short-wavelength side.

The maximum with peak intensity being 10% or less of the maximum peak intensity of the spectrum is not included in the above-mentioned maximum closest to the short-wavelength side of the spectrum. The tangent drawn at a point of the maximum spectral value being closest to the short-wavelength side and having the maximum inclination is defined as a tangent to the rise of the phosphorescence spectrum on the short-wavelength side.

For phosphorescence measurement, a spectrophotofluorometer body F-4500 and optional accessories for low temperature measurement (which were manufactured by Hitachi High-Technologies Corporation) were used. The measurement instrument is not limited to this arrangement. A combination of a cooling unit, a low temperature container, an excitation light source and a light-receiving unit may be used for measurement.

(Measurement 3) ΔST

ΔST was obtained as a difference between EgS and $Eg_{77K}$ measured in the above Measurement 1 and Measurement 2 (see the above numerical formula (3)). The results are shown in Table 1.

A half bandwidth of photoluminescence spectrum was obtained as follows.

Each of the compounds was formed in a 100 nm-thick film on a glass substrate with a deposition apparatus to prepare a sample for fluorescence measurement.

The sample for fluorescence measurement was placed so as to be irradiated with light in a direction orthogonal to the glass substrate. The sample for fluorescence measurement was irradiated with excitation light at a room temperature 300K, so that fluorescence intensity was measured while changing a wavelength.

The photoluminescence spectrum was expressed in coordinates of which ordinate axis indicated fluorescence intensity and of which abscissa axis indicated the wavelength. For fluorescence measurement, a spectrophotofluorometer F-4500 (manufactured by Hitachi High-Technologies Corporation) was used.

The half bandwidth (unit: nm) was measured based on the photoluminescence spectrum.

The compounds H1-1 and H1-2 were measured in terms of the half bandwidth. The results are shown in Table 1.

TABLE 1

|  | EgS (thin film) [eV] | Eg(77 K) [eV] | ΔST [eV] | Half bandwidth [nm] |
|---|---|---|---|---|
| H1-1 | 2.99 | 2.71 | 0.28 | 67 |
| H1-2 | 3.02 | 2.74 | 0.28 | 63 |

Preparation and Evaluation of Organic EL Device

The organic EL devices were prepared in the following manner and evaluated.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 77 nm thick.

After the glass substrate having the transparent electrode line was cleaned, the glass substrate was mounted on a substrate holder of a vacuum evaporation apparatus. Initially, a compound HA-1 was deposited on a surface of the glass substrate where the transparent electrode line was provided in a manner to cover the transparent electrode, thereby forming a 5-nm thick film of the compound HA-1. The HA-1 film serves as a hole injecting layer.

After the film formation of the HA-1 film, a compound HT-1 was deposited on the HA-1 film to form a 65-nm thick HT-1 film. The HT-1 film serves as a first hole transporting layer.

A compound HT-2 was deposited on the HT-1 film to form a 10-nm thick HT-2 film. The HT-2 film serves as a second hole transporting layer.

Further, a compound H1-1 (the first host material), a compound H2-1 (the second host material) and a compound YD-1 (the dopant material) were co-deposited on the HT-2 film to form a 25-nm thick emitting layer. A concentration of the first host material was set at 40 mass %, a concentration of the second host material was set at 40 mass %, and a concentration of the dopant material was set at 20 mass % in the emitting layer.

An electron transporting compound ET-1 was deposited on the emitting layer to form a 5-nm thick hole blocking layer.

Further, a compound ET-2 was deposited on the ET-1 film to form a 30-nm thick electron transporting layer.

LiF was deposited on the electron transporting layer to form a 1-nm thick LiF layer.

A metal Al was deposited on the LiF film to form an 80-nm thick metal cathode.

A device arrangement of the organic EL device in Example 1 is schematically shown in Table 2.

In Table 2, numerals in parentheses represent a film thickness (unit: nm). Likewise, the numerals represented by percentage in parentheses, which is positioned after the numerals representing the film thickness, indicate a material concentration in the emitting layer. In the emitting layer including the first and second host materials, a mass concentration (unit: mass %) of the second host material and a mass concentration (unit: mass %) of the dopant material are shown in this order. When the emitting layer includes only one of the host materials, a mass concentration of the dopant material in the emitting layer is shown. Further, in the layers other than the emitting layer, a mass concentration (unit: mass %) of an added component other than the main component is shown.

A material for forming the emitting layer is separately shown in Table 3.

Comparatives 1 to 2

In Comparatives 1 to 2, organic EL devices were prepared in the same manner as in the Example 1 so as to each have a device arrangement as shown in Table 2 by replacing the materials for the emitting layer.

TABLE 2

|  | Device Arrangement |
| --- | --- |
| Example 1 | ITO(77)/HA-1(5)/HT-1(65)/HT-2(10)/ H1-1: H2-1: YD-1(25: 40%, 20%)/ ET-1(5)/ET-2(30)/LiF(1)/Al(80) |
| Comparative 1 | ITO(77)/HA-1(5)/HT-1(65)/HT-2(10)/ H1-1: YD-1(25: 20%)/ET-1(5)/ET-2(30)/ LiF(1)/Al(80) |
| Comparative 2 | ITO(77)/HA-1(5)/HT-1(65)/HT-2(10)/ H2-1: YD-1(25: 20%)/ET-1(5)/ET-2(30)/ LiF(1)/Al(80) |

TABLE 3

|  | First Host Material | Second Host Material | Dopant Material |
| --- | --- | --- | --- |
| Example 1 | H1-1 | H2-1 | YD-1 |
| Comparative 1 | H1-1 | None | YD-1 |
| Comparative 2 | None | H2-1 | YD-1 |

Evaluation of Organic EL Devices

The prepared organic EL devices were evaluated in terms of drive voltage, luminous intensity, CIE1931 chromaticity, current efficiency L/J, power efficiency η, main peak wavelength $\lambda_p$, external quantum efficiency EQE, and a delayed fluorescence ratio. Evaluation results of the above points except for the delayed fluorescence ratio at the current density of 1.00 mA/cm$^2$ are shown in Table 4.

Drive Voltage

Electrical current was applied between ITO and Al such that a current density was 1.00 mA/cm$^2$, where voltage (unit: V) was measured.

CIE1931 Chromaticity

Voltage was applied on each of the organic EL devices such that a current density was 1.00 mA/cm$^2$, where coordinates (x, y) of CIE1931 chromaticity were measured by a spectroradiometer (CS-1000 manufactured by Konica Minolta Holdings, Inc.).

Current Efficiency L/J and Power Efficiency η

Voltage was applied on each of the organic EL devices such that the current density was 1.00 mA/cm$^2$, where spectral radiance spectra were measured by the aforementioned spectroradiometer. Based on the obtained spectral radiance spectra, the current efficiency (unit: cd/A) and the power efficiency η (unit: 1 m/W) were calculated.

Main Peak Wavelength $\lambda_p$

A main peak wavelength $\lambda_p$ was calculated based on the obtained spectral-radiance spectra.

External Quantum Efficiency EQE

The external quantum efficiency EQE (unit: %) was calculated based on the obtained spectral-radiance spectra, assuming that the spectra was provided under a Lambertian radiation.

Delayed Fluorescence Ratio

Voltage pulse waveform (pulse width: 500 micro second, frequency: 20 Hz, voltage: equivalent to 0.1 to 100 mA/cm$^2$) output from a pulse generator (8114A: manufactured by Agilent Technologies) was applied. EL emission was input in a photomultiplier (R928: manufactured by Hamamatsu Photonics K.K.). The pulse voltage waveform and the EL emission were synchronized and loaded in an oscilloscope (2440: manufactured by Tektronix Company) to obtain a transitional EL waveform. Reciprocal numbers of square root of luminous intensity were plotted, which were fitted in a linear line using a value before the elapse of 10$^{-5}$ seconds calculated by the method of least squares to determine a delayed fluorescence ratio.

Figure 9:
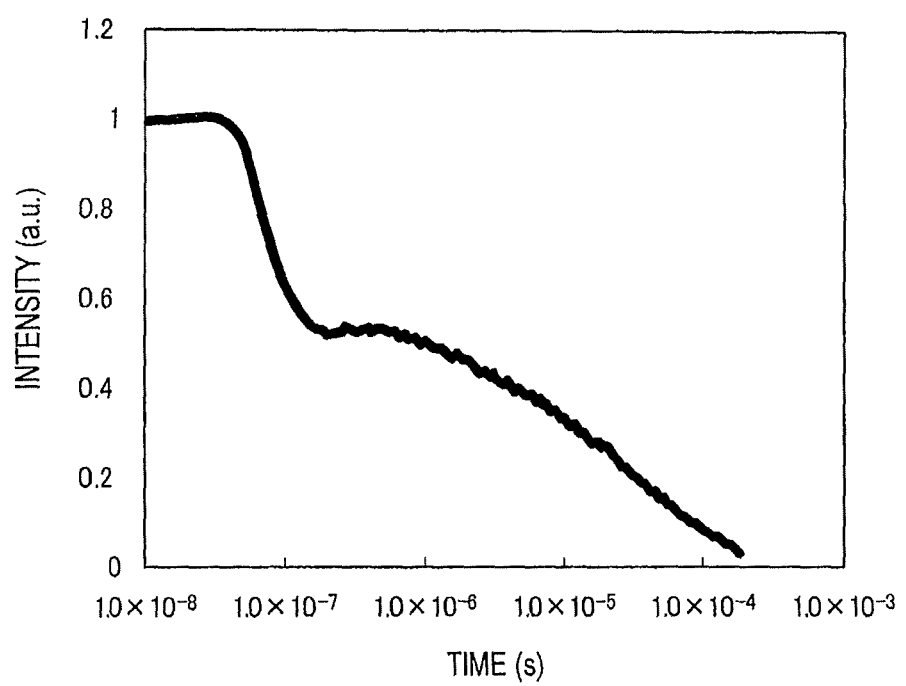
FIG. 9 is a graph showing time-varying luminous intensities of the organic EL device according to the exemplary embodiment of the invention.

The transitional EL waveform where voltage of 1.00 mA/cm$^2$ was applied on the organic EL device of the Example 1 at the room temperature is shown in FIG. 9. The pulse voltage was removed at the time of about 3×10$^{-8}$ seconds.

Based on the graph, where the voltage removal time was a starting point and the reciprocal numbers of the square root of luminous intensity before the elapse of 1.5×10$^{-5}$ seconds after voltage removal were plotted, the delayed fluorescence ratio of the organic EL device of the Example 1 was 49.0%. This delayed fluorescence ratio exceeded the theoretical upper-limit (37.5%) of the TTF ratio.

It was read from the graph in FIG. 9 that a residual intensity ratio in 1 μs was 50.0%.

TABLE 4

|  | Voltage [V] at 1 mA/cm$^2$ | chromaticity x | chromaticity y | L/J [cd/A] | η [lm/W] | EQE [%] | λp [nm] |
| --- | --- | --- | --- | --- | --- | --- | --- |
| Example 1 | 3.41 | 0.525 | 0.473 | 30.69 | 28.27 | 10.81 | 575 |
| Comparative 1 | 3.37 | 0.539 | 0.459 | 14.79 | 13.77 | 5.49 | 580 |
| Comparative 2 | 3.10 | 0.513 | 0.485 | 27.52 | 27.93 | 9.29 | 571 |

Example 2

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 77 nm thick.

After the glass substrate having the transparent electrode line was cleaned, the glass substrate was mounted on a substrate holder of a vacuum evaporation apparatus. Initially, a compound HA-1 was deposited on a surface of the glass substrate where the transparent electrode line was provided in a manner to cover the transparent electrode, thereby forming a 5-nm thick film of the compound HA-1. The HA-1 film serves as a hole injecting layer.

After the film formation of the HA-1 film, a compound HT-1 was deposited on the HA-1 film to form a 125-nm thick HT-1 film. The HT-1 film serves as a first hole transporting layer.

A compound HT-2 was deposited on the HT-1 film to form a 25-nm thick HT-2 film. The HT-2 film serves as a second hole transporting layer.

Further, a compound H1-2 (the first host material), a compound H2-2 (the second host material) and a compound BD-1 (the dopant material) were co-deposited on the HT-2 film to form a 25-nm thick emitting layer. A concentration of the first host material was set at 48 mass %, a concentration of the second host material was set at 48 mass %, and a concentration of the dopant material was set at 4 mass % in the emitting layer.

An electron transporting compound ET-3 was deposited on the emitting layer to form a 5-nm thick hole blocking layer.

Further, the compound ET-2 and Liq were co-deposited on the ET-3 film to form a 20-nm thick electron transporting layer. The concentration of Liq was set at 50 mass %.

Liq was deposited on the electron transporting layer to form a 1-nm thick Liq film.

A metal Al was deposited on the Liq film to form an 80-nm thick metal cathode.

A device arrangement of each of the organic EL devices in Example 2 and Comparative 3 is schematically shown in Table 5.

A material for forming the emitting layer is separately shown in Table 6.

The organic EL device in Example 2 was evaluated in the same manner as in Example 1 in terms of drive voltage, luminous intensity, CIE1931 chromaticity, current efficiency L/J, power efficiency η, main peak wavelength $\lambda_p$, external quantum efficiency EQE, and a delayed fluorescence ratio. Evaluation results of the above items except for the delayed fluorescence ratio at the current density of 1.00 mA/cm$^2$ are shown in Table 7 and those at the current density of 10.00 mA/cm$^2$ are shown in Table 8.

Figure 10:
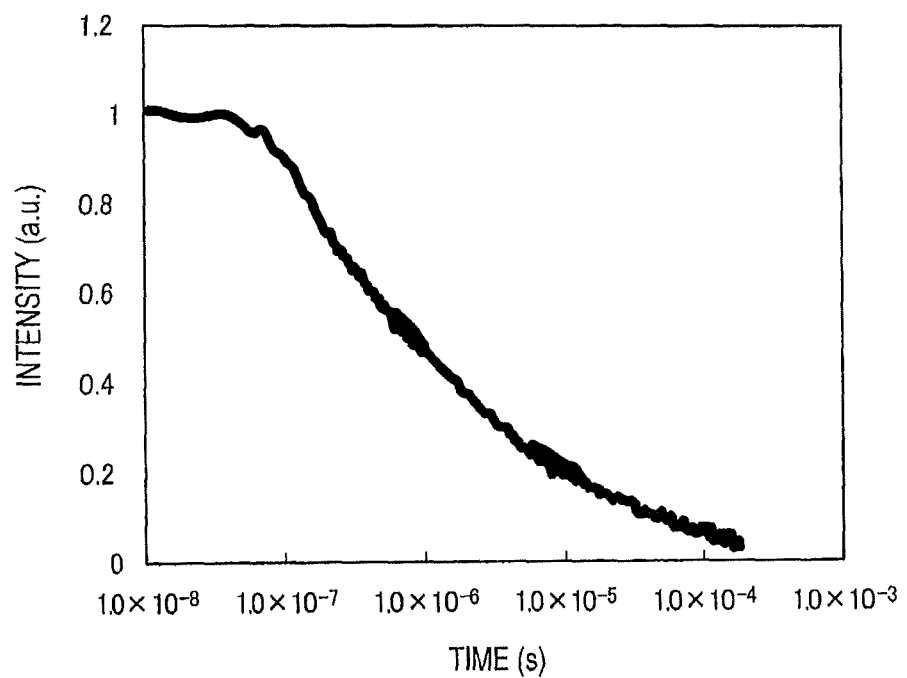
FIG. 10 is another graph showing time-varying luminous intensities of the organic EL device according to the exemplary embodiment of the invention.

The transitional EL waveform where voltage of electrical current was applied at 1.00 mA/cm$^2$ on the organic EL device of the Example 2 at the room temperature is shown in FIG. 10. The delayed fluorescence ratio of the organic EL device of the Example 2 calculated in the same manner as the above based on the transitional EL waveform shown in FIG. 10 was 43.0%.

It was read from the graph in FIG. 10 that a residual intensity ratio in 1 μs was 47.0%.

Comparative 3

An organic EL device in Comparative 3 was prepared in the same manner as in the Example 2 so as to have a device arrangement as shown in Table 5 by replacing the materials for the emitting layer.

The organic EL device prepared in Comparative 3 was evaluated in the same manner as in Example 1. Evaluation results of the above points except for the delayed fluorescence ratio at the current density of 1.00 mA/cm$^2$ are shown in Table 7 and those at the current density of 10.00 mA/cm$^2$ are shown in Table 8.

Figure 11:
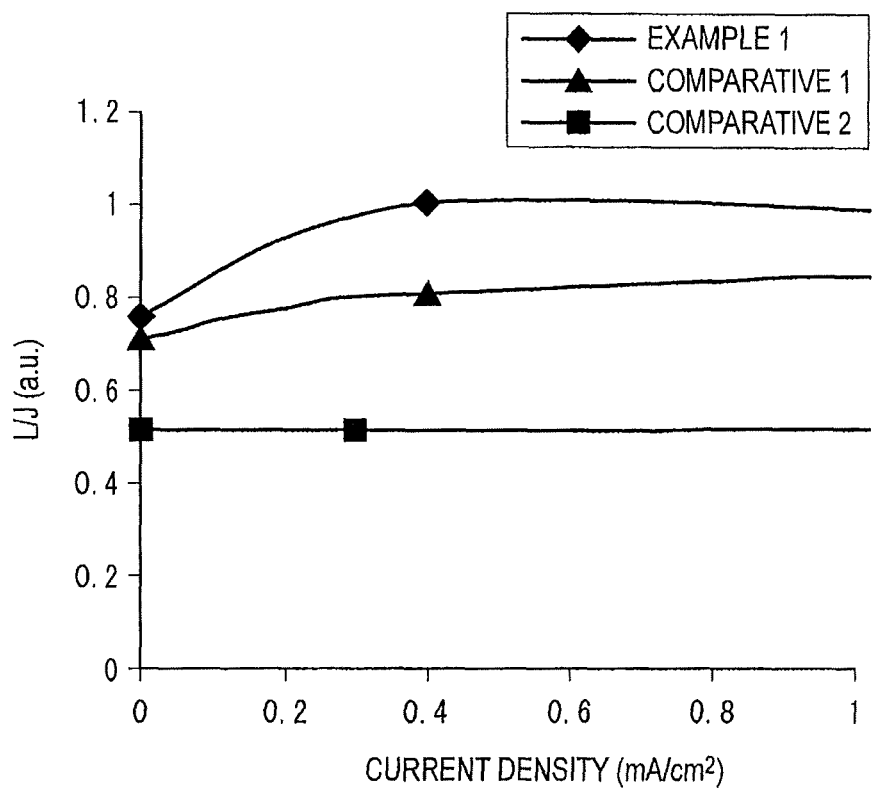
FIG. 11 is a graph showing a relationship between a current density and the luminous efficiency of the organic EL device according to the exemplary embodiment of the invention.
Figure 12:
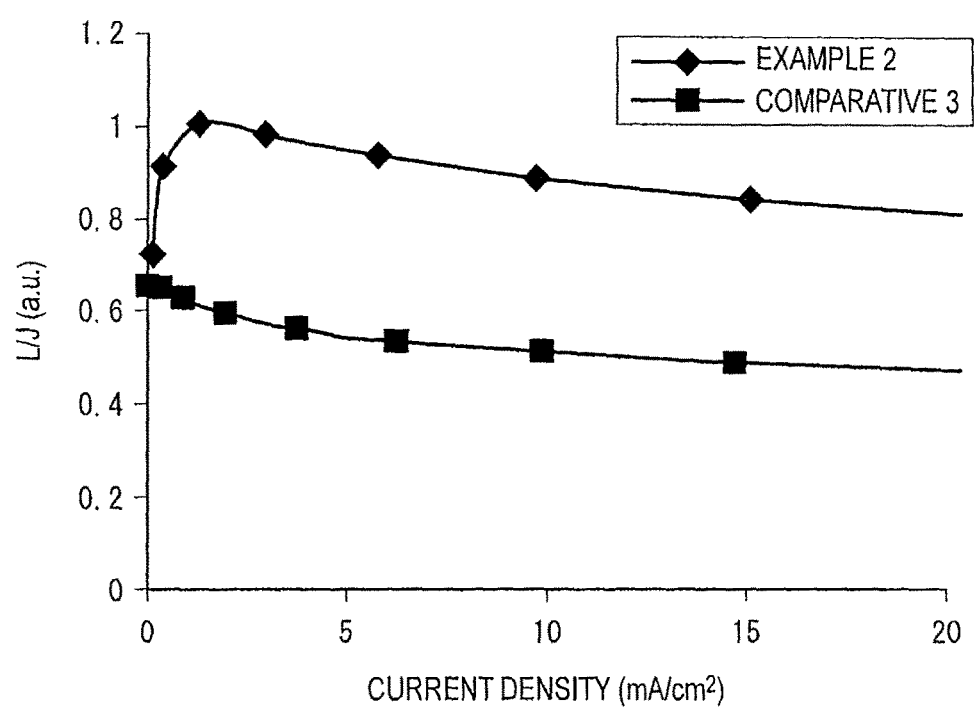
FIG. 12 is another graph showing a relationship between a current density and the luminous efficiency of the organic EL device according to the exemplary embodiment of the invention.

With respect to the organic EL device in each of Examples 1 to 2 and Comparatives 1 to 3, luminous efficiency (L/J) was standardized and plotted so as to show a relationship between the current density (mA/cm$^2$) and the luminous efficiency. FIG. 11 shows the luminous efficiency in Example 1 and Comparatives 1 and 2. FIG. 12 shows the luminous efficiency in Example 2 and Comparative 3. In FIGS. 11 and 12, an abscissa axis shows the current density (mA/cm$^2$) while an ordinate axis shows a value obtained by standardizing the luminous efficiency (L/J arbitrary unit (a.u.)). Herein, with respect to the organic EL device in Example 1 in FIG. 11 and the organic EL device in Example 2 in FIG. 12, the value obtained by standardizing the luminous efficiency is a value calculated with the proviso that the maximum luminous efficiency in each of Examples is defined as 1.

TABLE 4

| | Device Arrangement |
|---|---|
| Example 2 | ITO(77)/HA-1(5)/HT-1(125)/HT-2(25)/ H1-2: H2-2: BD-1(25: 48%, 4%)/ ET-3(5)/ET-2: Liq(20, 50%)/Liq(1)/Al(80) |
| Comparative 3 | ITO(77)/HA-1(5)/HT-1(125)/HT-2(25)/ H1-2: BD-1(25: 4%)/ET-3(5)/ ET-2: Liq(20, 50%)/Liq(1)/Al(80) |

TABLE 5

| | First Host Material | Second Host Material | Dopant Material |
|---|---|---|---|
| Example 2 | H1-2 | H2-2 | BD-1 |
| Comparative 3 | H1-2 | None | BD-1 |

TABLE 6

| | Voltage [V] at 1 mA/cm$^2$ | chromaticity x | chromaticity y | L/J [cd/A] | η [lm/W] | EQE [%] | λp [nm] |
|---|---|---|---|---|---|---|---|
| Example 2 | 3.45 | 0.128 | 0.208 | 11.12 | 10.14 | 7.75 | 472 |
| Comparative 3 | 3.54 | 0.132 | 0.205 | 6.92 | 6.14 | 4.84 | 472 |

TABLE 7

| | Voltage [V] at 10 mA/cm² | chromaticity x | chromaticity y | L/J [cd/A] | η [lm/W] | EQE [%] | λp [nm] |
|---|---|---|---|---|---|---|---|
| Example 2 | 4.28 | 0.128 | 0.205 | 9.92 | 7.29 | 6.97 | 472 |
| Comparative 3 | 4.52 | 0.132 | 0.195 | 5.74 | 3.99 | 4.15 | 472 |

As obviously understood from Tables 4, 7 and 8 and FIGS. 11 and 12, the organic EL devices of Examples 1 and 2 emitted light with a high efficiency in a practically high current density range by using the first and second host materials satisfying the aforementioned relationship in the emitting layer, as compared with Comparatives 1 and 3 in which only the first host material is used (see Table 3, FIG. 11; Table 6, FIG. 12) and Comparative 2 in which only the second host material is used (see Table 6, FIG. 12).

Reference Example

Herein, the organic EL device described in the non-Patent Literature 1 is shown as a reference example and compared with the organic EL device of Example 1 in terms of the device arrangement.

A device arrangement of the organic EL devices in the reference example is schematically shown below in the same manner as in Example 1.

ITO(110)/NPD(40)/m-CP(10)/m-CP PIC-TRZ(20.6%)/BP4mPy(40)/LiF(0.8)/Al(70) Compounds used in the reference example will be shown below.

[Formula 16]

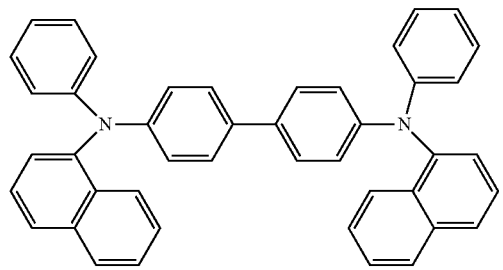

α-NPD

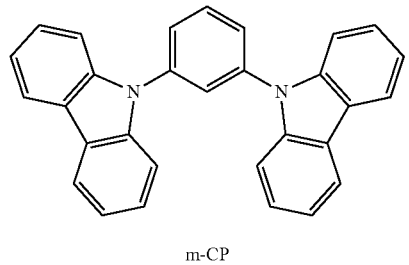

m-CP

-continued

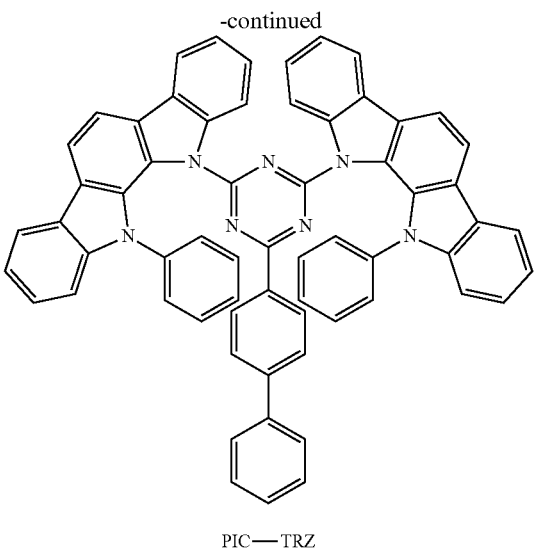

PIC—TRZ

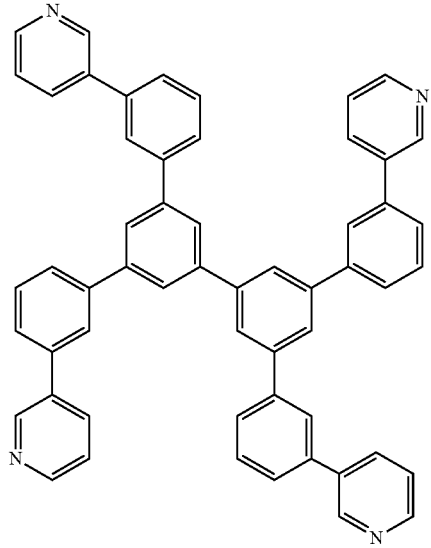

BP4mPy

The device only exhibits the maximum EQE of 5.1% in the current density range of 0.01 mA/cm² which is much lower than the current density range in a practical use. Accordingly, in a high current density range around 1 mA/cm² and 10 mA/cm², roll-off is generated to reduce a luminous efficiency.

Accordingly, it is recognized that the organic EL devices of Examples 1 and 2 emitted light with a high efficiency even in the high current density range.

INDUSTRIAL APPLICABILITY

The invention can provide an organic electroluminescence device efficiently emitting light in a practically high current density range.

EXPLANATION OF CODE(S)

1: organic EL device, 2: substrate, 3: anode, 4: cathode, 5: emitting layer, 6: hole transporting layer, 7: electron transporting layer

The invention claimed is:

1. An organic electroluminescence device comprising a pair of electrodes and an organic compound layer therebetween, the organic compound layer comprising an emitting layer comprising: a first material; a second material; and a third material, wherein
   singlet energy EgS(H1) of the first material, singlet energy EgS(H2) of the second material, and singlet energy EgS(D) of the third material satisfy a relationship of numerical formulae (1) and (2) below,
   the singlet energy EgS(H1) of the first material and the singlet energy EgS(H2) of the second material satisfy a relationship of numerical formula (8) below,
   a difference $\Delta ST(H1)$ between the singlet energy EgS(H1) of the first material and an energy gap $Eg_{77K}(H1)$ at 77K of the first material satisfies a relationship of a numerical formula (3) below, and
   the third material is a fluorescent material, $$EgS(H1) > EgS(D) \tag{1}$$

$$EgS(H2) > EgS(D) \tag{2}$$

$$\Delta ST(H1) = EgS(H1) - Eg_{77K}(H1) < 0.3 \text{ [eV]} \tag{3}$$

$$EgS(H2) \geq EgS(H1) \tag{8}.$$

2. The organic electroluminescence device according to claim 1, wherein
   the difference $\Delta ST(H1)$ between the singlet energy EgS(H1) of the first material and the energy gap $Eg_{77K}(H1)$ at 77K of the first material satisfies a relationship of a numerical formula (4) below, $$\Delta ST(H1) = EgS(H1) - Eg_{77K}(H1) < 0.2 \text{ [eV]} \tag{4}.$$

3. The organic electroluminescence device according to claim 1, wherein
   the energy gap $Eg_{77K}(H1)$ at 77K of the first material and the energy gap $Eg_{77K}(D)$ at 77K of the third material satisfy a relationship of a numerical formula (7) below, $$Eg_{77K}(H1) - Eg_{77K}(D) > 0.5 \text{ [eV]} \tag{7}.$$

4. The organic electroluminescence device according to claim 1, wherein
   the organic electroluminescence device exhibits a delayed fluorescence ratio larger than 37.5%.

5. The organic electroluminescence device according to claim 1, wherein
   the organic electroluminescence device exhibits a residual intensity ratio larger than 36.0% after an elapse of 1 µs after voltage removal in a transitional EL measurement.

6. The organic electroluminescence device according to claim 1, wherein
   a half bandwidth of a photoluminescence spectrum of the first material is 50 nm or more.

7. The organic electroluminescence device according to claim 1, wherein
   an emission peak wavelength of the third material is in a range of 500 nm to 600 nm.

8. The organic electroluminescence device according to claim 1, wherein
   the singlet energy EgS(H1) of the first material and the singlet energy EgS(H2) of the second material satisfy a relationship of numerical formula (9) below, $$EgS(H2) > EgS(H1) \tag{9}$$

9. The organic electroluminescence device according to claim 1, wherein the emitting layer does not comprise a heavy-metal complex.

10. The organic electroluminescence device according to claim 1, wherein the first material exhibits a delayed fluorescence.

11. The organic electroluminescence device according to claim 2, wherein a half bandwidth of a photoluminescence spectrum of the first material is 50 nm or more, and the emitting layer does not comprise a heavy-metal complex.

12. The organic electroluminescence device according to claim 2, wherein a half bandwidth of a photoluminescence spectrum of the first material is 50 nm or more, and the first material exhibits a delayed fluorescence.

13. The organic electroluminescence device according to claim 2, wherein the emitting layer does not comprise a heavy-metal complex, and the first material exhibits a delayed fluorescence.

14. The organic electroluminescence device according to claim 2, wherein a half bandwidth of a photoluminescence spectrum of the first material is 50 nm or more, the emitting layer does not comprise a heavy-metal complex, and the first material exhibits a delayed fluorescence.

15. The organic electroluminescence device according to claim 1, wherein the first material is represented by a formula (101) below,

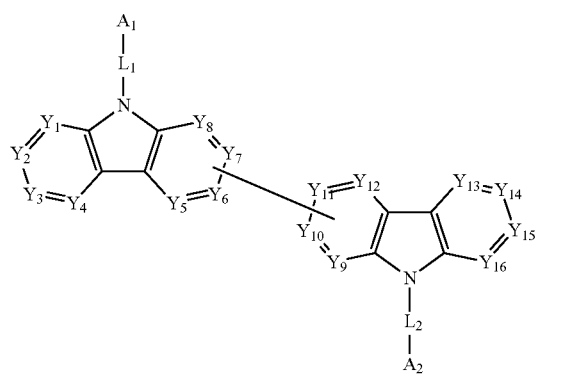

(101)

$A_1$ and $A_2$ is independently represent:
a hydrogen atom;
a halogen atom;
a cyano group;
a substituted or unsubstituted aromatic hydrocarbon group having 6 to 30 ring carbon atoms;
a substituted or unsubstituted aromatic heterocyclic group having 2 to 30 ring carbon atoms;
a substituted or unsubstituted alkyl group having 1 to 30 carbon atoms;
a substituted or unsubstituted cycloalkyl group having 3 to 30 ring carbon atoms;
a substituted or unsubstituted alkoxy group having 1 to 30 carbon atoms;

a substituted or unsubstituted aralkyl group having 7 to 30 carbon atoms;
a substituted or unsubstituted aryloxy group having 6 to 30 ring carbon atoms; or
a substituted or unsubstituted silyl group,
$Y_1$ to $Y_4$ and $Y_{13}$ to $Y_{16}$ each independently represent C(R) or a nitrogen atom,
$Y_5$ to $Y_8$ each independently represent C(R), a nitrogen atom or a carbon atom bonded to one of $Y_9$ to $Y_{12}$,
$Y_9$ to $Y_{12}$ each independently represent C(R), a nitrogen atom or a carbon atom bonded to one of $Y_5$ to $Y_8$,
R independently represents a hydrogen atom or a substituent, the substituent for R being the same as the substituent for $A_1$ and $A_2$, and
$L_1$ and $L_2$ each independently represent: a single bond; a substituted or unsubstituted divalent aromatic hydrocarbon group having 6 to 30 ring carbon atoms; a substituted or unsubstituted divalent aromatic heterocyclic group having 2 to 30 ring carbon atoms; or a group formed by bonding the above divalent aromatic hydrocarbon group and the above divalent aromatic heterocyclic group.

16. The organic electroluminescence device according to claim 15, wherein at least one of $A_1$ and $A_2$ is a cyano group.

17. The organic electroluminescence device according to claim 15, wherein $A_1$ and $A_2$ each independently represent a substituted or unsubstituted aromatic hydrocarbon group having 6 to 30 ring carbon atoms or a substituted or unsubstituted aromatic heterocyclic group having 2 to 30 ring carbon atoms.

18. The organic electroluminescence device according to claim 15, wherein
$A_1$ represent a substituted or unsubstituted aromatic hydrocarbon group having 6 to 30 ring carbon atoms and $A_2$ represent a substituted or unsubstituted aromatic heterocyclic group having 2 to 30 ring carbon atoms or
$A_1$ represent a substituted or unsubstituted aromatic heterocyclic group having 2 to 30 ring carbon atoms and $A_2$ represent a substituted or unsubstituted aromatic hydrocarbon group having 6 to 30 ring carbon atoms.

19. The organic electroluminescence device according to claim 15, wherein
$Y_1$ to $Y_4$ and $Y_{13}$ to $Y_{16}$ independently represent C(R),
$Y_5$ to $Y_8$ independently represent C(R) or a carbon atom to be bonded to one of $Y_9$ to $Y_{12}$,
$Y_9$ to $Y_{12}$ independently represent C(R) or a carbon atom to be bonded to one of $Y_5$ to $Y_8$, and
R independently represents a hydrogen atom or a substituent.

20. The organic electroluminescence device according to claim 15, wherein
one of $L_1$ and $L_2$ represents a single bond, and
the other of $L_1$ and $L_2$ is represented by a formula (a) below,

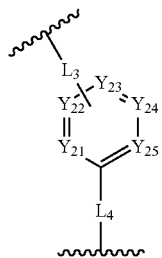

(a)

where, in the formula (a), $Y_{21}$ to $Y_{25}$ each independently represent C($R_a$), a nitrogen atom or a carbon atom bonded to $L_3$, $R_a$ independently represents a hydrogen atom or a substituent, the substituent for $R_a$ being the same as the substituent for $A_1$ and $A_2$, and
$L_3$ and $L_4$ each independently represent: a single bond; a substituted or unsubstituted divalent aromatic hydrocarbon group having 6 to 30 ring carbon atoms; a substituted or unsubstituted divalent aromatic heterocyclic group having 2 to 30 ring carbon atoms; or a group formed by bonding the above divalent aromatic hydrocarbon group and the above divalent aromatic heterocyclic group.

21. The organic electroluminescence device according to claim 15, wherein
one of $L_1$ and $L_2$ represents a substituted or unsubstituted divalent aromatic hydrocarbon group having 6 to 30 ring carbon atoms, a substituted or unsubstituted divalent aromatic heterocyclic group having 2 to 30 ring carbon atoms, or a group formed by bonding the substituted or unsubstituted divalent aromatic hydrocarbon group and the substituted or unsubstituted divalent aromatic heterocyclic group, and
the other of $L_1$ and $L_2$ is represented by a formula (a) below,

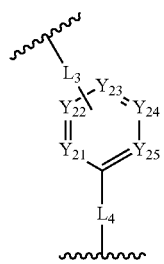

(a)

where, in the formula (a), $Y_{21}$ to $Y_{25}$ each independently represent C($R_a$), a nitrogen atom or a carbon atom bonded to $L_3$,
$R_a$ independently represents a hydrogen atom or a substituent, the substituent for $R_a$ being the same as the substituent for $A_1$ and $A_2$, and
$L_3$ and $L_4$ each independently represent: a single bond; a substituted or unsubstituted divalent aromatic hydrocarbon group having 6 to 30 ring carbon atoms; a substituted or unsubstituted divalent aromatic heterocyclic group having 2 to 30 ring carbon atoms; or a group formed by bonding the above divalent aromatic hydrocarbon group and the above divalent aromatic heterocyclic group.

22. The organic electroluminescence device according to claim 15, wherein
at least one of $L_1$ and $L_2$ is represented by a formula (a) below,

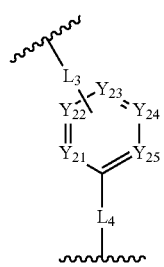

(a)

where, in the formula (a), $Y_{21}$ to $Y_{25}$ each independently represent $C(R_a)$ or a carbon atom bonded to $L_3$, $R_a$ independently represents a hydrogen atom or a substituent, the substituent for $R_a$ being the same as the substituent for $A_1$ and $A_2$, and $L_3$ and $L_4$ each independently represent: a single bond; a substituted or unsubstituted divalent aromatic hydrocarbon group having 6 to 30 ring carbon atoms; a substituted or unsubstituted divalent aromatic heterocyclic group having 2 to 30 ring carbon atoms; or a group formed by bonding the above divalent aromatic hydrocarbon group and the above divalent aromatic heterocyclic group.

23. The organic electroluminescence device according to claim 15, wherein $A_1$ is a cyano group, $L_1$ is represented by a formula (a) below,

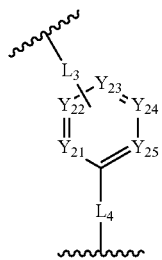

(a)

where, in the formula (a), $Y_{21}$ to $Y_{25}$ each independently represent $C(R_a)$, a nitrogen atom or a carbon atom bonded to $L_3$, $R_a$ independently represents a hydrogen atom or a substituent, the substituent for $R_a$ being the same as the substituent for $A_1$ and $A_2$, and $L_3$ and $L_4$ each independently represent: a single bond; a substituted or unsubstituted divalent aromatic hydrocarbon group having 6 to 30 ring carbon atoms; a substituted or unsubstituted divalent aromatic heterocyclic group having 2 to 30 ring carbon atoms; or a group formed by bonding the above divalent aromatic hydrocarbon group and the above divalent aromatic heterocyclic group.

24. The organic electroluminescence device according to claim 23, wherein $A_2$ is a substituted or unsubstituted aromatic hydrocarbon group having 6 ring carbon atoms, $L_2$ is a single bond, $Y_1$ to $Y_4$ and $Y_{13}$ to $Y_{16}$ each independently represent $C(R)$, $Y_5$ to $Y_8$ each independently represent $C(R)$ or a carbon atom bonded to one of $Y_9$ to $Y_{12}$, and $Y_9$ to $Y_{12}$ each independently represent $C(R)$ or a carbon atom bonded to one of $Y_5$ to $Y_8$.

25. The organic electroluminescence device according to claim 24, wherein the difference $\Delta ST(H1)$ between the singlet energy EgS (H1) of the first material and the energy gap $Eg_{77K}(H1)$ at 77K of the first material satisfies formula (4) below:

$$\Delta ST(H1)=EgS(H1)-Eg_{77K}(H1)<0.2 \ [eV] \qquad (4),$$

a half bandwidth of a photoluminescence spectrum of the first material is 50 nm or more, the emitting layer does not comprise a heavy-metal complex, the first material exhibits a delayed fluorescence.

26. The organic electroluminescence device according to claim 15, wherein $A_1$ is a substituted or unsubstituted pyrimidine or a substituted or unsubstituted triazine.

27. The organic electroluminescence device according to claim 26, wherein $A_2$ is a substituted or unsubstituted aromatic hydrocarbon group having 6 ring carbon atoms, $L_1$ is a single bond, $L_2$ is a single bond, $Y_1$ to $Y_4$ and $Y_{13}$ to $Y_{16}$ each independently represent $C(R)$, $Y_5$ to $Y_8$ each independently represent $C(R)$ or a carbon atom bonded to one of $Y_9$ to $Y_{12}$, and $Y_9$ to $Y_{12}$ each independently represent $C(R)$ or a carbon atom bonded to one of $Y_5$ to $Y_8$.

28. The organic electroluminescence device according to claim 27, wherein the difference $\Delta ST(H1)$ between the singlet energy EgS (H1) of the first material and the energy gap $Eg_{77K}(H1)$ at 77K of the first material satisfies formula (4) below:

$$\Delta ST(H1)=EgS(H1)-Eg_{77K}(H1)<0.2 \ [eV] \qquad (4),$$

a half bandwidth of a photoluminescence spectrum of the first material is 50 nm or more, the emitting layer does not comprise a heavy-metal complex, the first material exhibits a delayed fluorescence.

* * * * *